(12) United States Patent
Nguyen et al.

(10) Patent No.: US 8,704,316 B2
(45) Date of Patent: Apr. 22, 2014

(54) ETCHANT-FREE METHODS OF PRODUCING A GAP BETWEEN TWO LAYERS, AND DEVICES PRODUCED THEREBY

(75) Inventors: Clark Tu-Cuong Nguyen, Oakland, CA (US); Li-Wen Hung, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 19 days.

(21) Appl. No.: 13/481,672

(22) Filed: May 25, 2012

(65) Prior Publication Data

US 2013/0134528 A1 May 30, 2013

Related U.S. Application Data

(63) Continuation-in-part of application No. PCT/US2011/022282, filed on Jan. 24, 2011.

(60) Provisional application No. 61/297,582, filed on Jan. 22, 2010, provisional application No. 61/297,743, filed on Jan. 23, 2010, provisional application No. 61/431,360, filed on Jan. 10, 2011, provisional application No. 61/491,114, filed on May 27, 2011.

(51) Int. Cl.
*H01L 29/84* (2006.01)
*H01H 59/00* (2006.01)
*G01P 15/08* (2006.01)
*G01P 15/125* (2006.01)

(52) U.S. Cl.
CPC ........ *H01H 59/0009* (2013.01); *G01P 15/0802* (2013.01); *B81B 2203/0118* (2013.01); *G01P 15/125* (2013.01); *B81B 2201/0235* (2013.01)
USPC ........................................................ 257/415

(58) Field of Classification Search
CPC ............ H01H 59/0009; G01P 15/0802; G01P 15/125; B81B 2203/0118; B81B 2201/0235
USPC ........................................................ 257/415
See application file for complete search history.

(56) References Cited

U.S. PATENT DOCUMENTS

| 2003/0151091 A1 | 8/2003 | Palm et al. |
| 2005/0206479 A1 | 9/2005 | Nguyen et al. |
| 2008/0009134 A1 | 1/2008 | Hung et al. |

OTHER PUBLICATIONS

L.-W. Hung et al., 'Capacitive-piezo transducers for higher Q contour-mode AlN resonators at 1.2 GHz' Tech. Digest, 2008, Solid-State Sensor, Actuator, and Microsystems Workshop, Hilton Head, South Carolina, Jun. 6-10, 2010, pp. 463-466.

L-W. Hung et al., 'Capacitive-Piezoelectric AlN Resonators With Q>12,000' Tech. Digest, 24th IEEE Int. Conf. on Micro Electro Mechanical Systems (MEMS'11), Cancun, Mexico, Jan. 24-28, 2011, pp. 173-176.

*Primary Examiner* — Anthony Ho
(74) *Attorney, Agent, or Firm* — Bozicevic, Field & Francis LLP; Bret E. Field

(57) ABSTRACT

Etchant-free methods of producing a gap between two materials are provided. Aspects of the methods include providing a structure comprising a first material and a second material, and subjecting the structure to conditions sufficient to cause a decrease in the volume of at least a portion of at least one of the first material and the second material to produce a gap between the first material and the second material. Also provided are devices produced by the methods (e.g., MEMS and NEMS devices), structures used in the methods and methods of making such structures.

11 Claims, 23 Drawing Sheets

ETCHANT-FREE METHODS OF PRODUCING A GAP BETWEEN TWO LAYERS, AND DEVICES PRODUCED THEREBY

CROSS-REFERENCE TO RELATED APPLICATIONS

This application is a continuation-in-part of PCT Application No. PCT/US2011/022282, which claims the benefit of priority under 35 U.S.C. §119(e) to U.S. Provisional Patent Application Ser. Nos. 61/297,582, filed Jan. 22, 2010; 61/297,743, filed Jan. 23, 2010 and 61/431,360, filed Jan. 10, 2011 and also claims the benefit under 35 U.S.C. §119(e) to U.S. Provisional Patent Application Ser. No. 61/491,114, filed May 27, 2011; the disclosures of each of which applications are hereby incorporated by reference in their entirety.

REFERENCE TO GOVERNMENT SUPPORT

This invention was made with government support under a grant from the Defense Advanced Research Projects Agency (DARPA) (Award No. HR011-06-1-0041). The government has certain rights in this invention.

INTRODUCTION

Microelectromechanical systems (MEMS) are small electromechanical devices made up of micron dimensioned components, e.g., ranging in size between 1 to 1000 micrometers. Nanoelectromechanical systems or NEMS are devices integrating electrical and mechanical functionality on the nanoscale.

Release processes, whereby sacrificial material between two structural materials is removed to free them from one another, often are limiting and costly steps in MEMS (as well as NEMS) fabrication. Such processes generally employ liquids or gases to etch and may have drawbacks, including stiction, the need for long release times governed by mass transport rates that lengthen as gap aspect-ratio increases; the undesired degradation of unintended layers due to finite etchant selectivity; and the formation of etch byproducts (e.g., bubbles and etch byproduct compounds) that remain in the gaps. These potential drawbacks to etching processes often require alterations in MEMS designs (e.g., etchant release holes) that may compromise the performance of applications employing high-aspect ratio gaps.

SUMMARY

Etchant-free methods of producing a gap between two materials are provided. Aspects of the methods include providing a structure comprising a first material and a second material, and subjecting the structure to conditions sufficient to cause a decrease in the volume of at least a portion of at least one of the first material and the second material to produce a gap between the first material and the second material. Also provided are devices produced by the methods (e.g., MEMS and NEMS devices), structures used in the methods and methods of making such structures.

Aspects of the present disclosure include a method of producing a gap between a first material and a second material of a structure. The method includes subjecting a structure that includes a first material and a second material to conditions sufficient to cause a decrease in the volume of at least a portion of at least one of the first material and the second material to produce a gap between the first material and the second material.

In certain embodiments, the subjecting includes subjecting the structure to electromagnetic radiation.

In some cases, the gap is horizontally oriented with respect to the structure.

In certain instances, the gap is vertically oriented with respect to the structure.

Aspects of the present disclosure also include embodiments where the structure further includes an intermediate material positioned between the first material and the second material, and where the subjecting includes subjecting the structure to conditions sufficient for at least a portion of the intermediate material and the first material to react to produce a product compound and a gap between the first material and the second material.

In certain embodiments, the first layer includes silicon, the intermediate layer includes a metal and the product compound includes a silicide.

In some cases, the metal is Ni, Ti, Pt, Co or Mo.

In certain instances, the second layer is selected from an oxide, silicon and a metal.

In certain embodiments, the conditions include subjecting the structure to a temperature ranging from 150 to 1000° C. for 2 minutes or less.

In certain instances, the gap has an aspect ratio of 250:1 or more.

In certain embodiments, the structure is a micron-scaled structure. In other embodiments, the structure is a nano-scaled structure.

Aspects of the present disclosure include a device that includes a structure. The structure includes a first material, a second material, and a product compound positioned between the first material and the second material, where the product compound includes at least a portion of the first material annealed with an intermediate material.

In some instances, the device is a MEMS device and in some instances, the device is a NEMS device.

Aspects of the present disclosure further include a structure that includes a first material and a second layer. In addition, at least one of first material and the second material is configured to decrease in volume when subjected to sufficient conditions to thereby produce a gap between the first material and the second material.

Aspects of the present disclosure further include a multi-layer structure that includes: a first material; a second material; and an intermediate material positioned between the first material and the second material. In addition, at least a portion of the intermediate material is configured to react with the first material when subjected to sufficient conditions to thereby produce a product compound and a gap between the first material and the second material.

In certain embodiments, the first layer includes silicon, the intermediate layer includes a metal and the product compound includes a silicide.

In some instances, the metal is Ni, Ti, Pt, Co or Mo.

Aspects of the present disclosure further include a method of producing a structure according to embodiments of the present disclosure. The method includes: depositing the intermediate material on the surface of the first material; and depositing the second material on at least a portion of the intermediate material.

In certain embodiments, the method further includes removing oxide from a surface of the first material prior to depositing the intermediate material on the surface of the first material.

Aspects of the present disclosure further include a capacitive piezoelectric transducer that includes a piezoelectric body, a first electrode arranged proximal to a first side of the piezoelectric body, where the first electrode is spaced apart from the piezoelectric body by a first distance, and a second electrode arranged proximal to a second side of the piezoelectric body, where the second electrode is spaced apart from the piezoelectric body by a second distance.

In certain embodiments, the transducer has a quality factor (Q) of 10,000 or more.

In some cases, the first side and the second side are opposing sides of the piezoelectric body.

In certain instances, the first distance and the second distance are each 50 nm or less.

Aspects of the present disclosure further include a transducer that includes an upper input electrode, an upper output electrode spaced apart laterally from the input electrode, a lower electrode, and a piezoelectric body positioned between the upper electrodes such that the piezoelectric body is spaced a first distance apart from the upper electrodes and a second distance apart from the lower electrode.

Aspects of the present disclosure further include a device that includes at least one capacitive piezoelectric transducer. The capacitive piezoelectric transducer includes a piezoelectric body, a first electrode arranged proximal to a first side of the piezoelectric body, where the first electrode is spaced apart from the piezoelectric body by a first distance, and a second electrode arranged proximal to a second side of the piezoelectric body, where the second electrode is spaced apart from the piezoelectric body by a second distance.

In certain embodiments, the device includes an array of the capacitive piezoelectric transducers.

Aspects of the present disclosure further include a method of producing a capacitive piezoelectric transducer. The method includes providing a layered substrate and releasing the piezoelectric layer, such that the first electrode is spaced apart from the piezoelectric layer by a first distance and the second electrode is spaced apart from the piezoelectric layer by a second distance. The layered substrate includes a base layer, a first electrode disposed on the base layer, a first layer disposed on the first electrode, a piezoelectric layer disposed on the first layer, a second layer disposed on the piezoelectric layer, and a second electrode disposed on the second layer.

In certain embodiments, the releasing includes subjecting the layered substrate to conditions sufficient for at least a portion of the first layer and the first electrode to react to produce a first product compound and a first gap between the first electrode and the piezoelectric layer, and for at least a portion of the second layer and the second electrode to react to produce a second product compound and a second gap between the second electrode and the piezoelectric layer.

In some cases, the subjecting includes subjecting the layered substrate to electromagnetic radiation.

BRIEF DESCRIPTION OF THE DRAWINGS

FIGS. 5(c) and 5(d) show SEM cross-sections of smaller diaphragms released in the same annealing step, according to embodiments of the present disclosure.

In FIG. 12(a), molybdenum was sputtered and patterned over a silicon substrate. In FIG. 12(b) 300 nm of PECVD oxide was deposited at 300° C. and removed over device areas and bond pads. In FIG. 12(c) 700 nm of titanium structural material was sputter deposited and patterned. In FIG. 12(d) the clamped-clamped beam was released via rapid thermal annealing at 750° C.

FIG. 32(d) shows a SEM image of the gaps generated after release, according to embodiments of the present disclosure.

DETAILED DESCRIPTION

Figure 1:
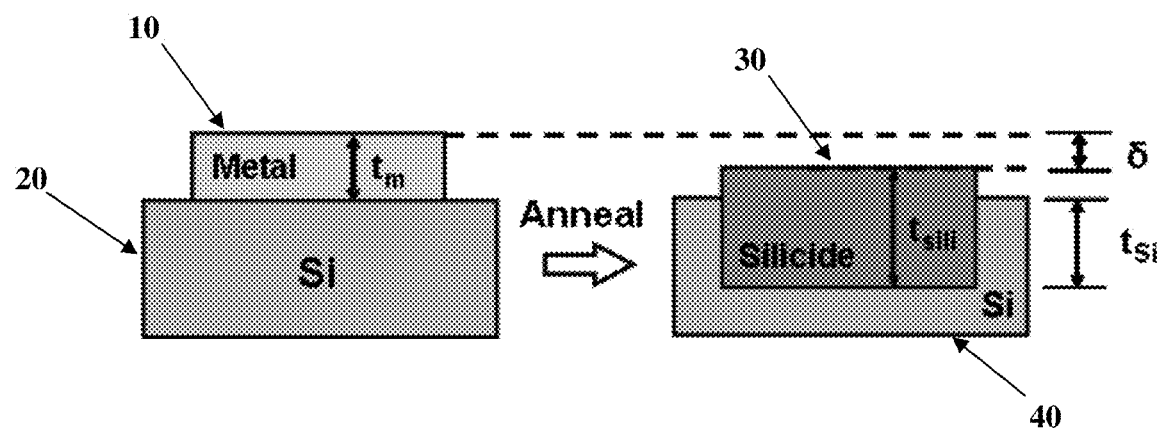
FIG. 1 shows a process flow schematic of a decrease in volume induced by the reaction of a metal with a silicon substrate to produce a silicide, according to embodiments of the present disclosure.

Etchant-free methods of producing a gap between two materials are provided. Aspects of the methods include providing a structure comprising a first material and a second material, and subjecting the structure to conditions sufficient to cause a decrease in the volume of at least a portion of at least one of the first material and the second material to produce a gap between the first material and the second material. Also provided are devices produced by the methods (e.g., MEMS and NEMS devices), structures used in the methods and methods of making such structures.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating unrecited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Methods

Aspects of the invention include an "etchless" or "etchant-free" method of forming a gap between materials in a structure. By "etchless" or "etchant-free" is meant that an etchant is not employed, e.g., a gaseous, fluid or plasma etchant, to produce a gap between two materials in a device of interest. Rather, a gap can be formed in methods disclosed herein by decreasing the volume of at least a portion of at least one of the materials in the structure. For example, the structure may include a first material and a second material, where at least a portion of at least one of the first material and the second material decreases in volume when subjected to sufficient conditions to produce a gap between the first material and the second material. Because etchants are not employed, the present methods may be used to form a gap between two materials without the use of corresponding reagents, solvents and/or systems typically required for an etching process. For instance, reagents, solvents and/or systems used to form the gaseous, fluid or plasma etchant are not used in the methods as disclosed herein to form a gap between materials in a structure. "Etchless" or "etchant-free" methods, as disclosed herein, may facilitate a minimization of certain problems typically associated with etching processes. For example, the etchant-free methods disclosed herein may facilitate a minimization in stiction and bubble formation that are typically associated with etching.

By "gap" is meant a void space composed of a vacuum or gas (e.g., air) between two materials in a structure. A gap may be oriented horizontally with respect to the structure, where the gap is substantially parallel to the support or substrate on which the structure is disposed. In some cases, the gap is vertically oriented with respect to the structure, where the gap is substantially perpendicular to the support or substrate on which the structure is disposed. Gaps formed by the methods and systems disclosed herein may also be at any other desired angle with respect to the support or substrate on which the structure is disposed. For example, a gap may be oriented at an angle with respect to the support or substrate on which the structure is disposed of 90 degrees or less, such as 60 degrees or less, including 30 degrees or less, or approximately parallel to the support or substrate on which the structure is disposed.

A gap may be a void space between an upper layer and a bottom layer of a structure, where the gap was formed according to the methods disclosed herein. For example, a gap may be a void space between a top structural or capping layer and a bottom substrate layer of a structure. By "layer" is meant a material that is adjacent at least a portion of another material in the structure. As described above regarding gaps, layers may be oriented horizontally, vertically, or at any other desired angle with respect to the support or substrate on which the structure is disposed. For example, a layer may be oriented at an angle with respect to the support or substrate on which the structure is disposed of 90 degrees or less, such as 60 degrees or less, including 30 degrees or less, or approximately parallel to the support or substrate on which the structure is disposed.

A layer may include a material chemically or physically different from adjacent layers of the structure. By "chemically different" is meant that the layer has a different chemical composition from one or more adjacent layers. For example, a layer may include a dielectric composition, whereas an adjacent layer may include a conductive or semi-conductive composition. By "physically different" is meant that the physical properties of the layer are different from one or more adjacent layers. For example, a layer may have a density or volume that is different from one or more adjacent layers.

In certain embodiments, the methods of the present disclosure include producing a gap between a first material and a second material of a structure, where the method includes subjecting a structure that includes a first material and a second material to conditions sufficient to cause a decrease in the volume of at least a portion of at least one of the first material and the second material to produce a gap between the first material and the second material. For example, the portion of the first material that is adjacent the second material may decrease in volume. In some cases the portion of the second material that is adjacent the first material decreases in volume. In some instances, both the portion of the first material that is adjacent the second material and the portion of the second material that is adjacent the first material decrease in volume. In certain embodiments, substantially all of the first material decreases in volume, such that portions of the first material adjacent to and/or away from the second material decrease in volume. In some cases, substantially all of the second material decreases in volume, such that portions of the second material adjacent to and/or away from the first material decrease in volume. In some instances, substantially all of both the first material and the second material decrease in volume.

In certain instances, the structure includes a first material and a second material, where the first material is adjacent the second material. The first and second material may be contacting each other such that there is substantially no gap between the first material and the second material. At least one of the first material and the second material may include a material that decreases in volume when subjected to certain conditions. After subjecting the structure to sufficient conditions to cause at least one of the first material and the second material to decrease in volume, a gap may form between the first material and the second material as the surfaces of the first material and the second material that were contacting each other begin to move away from each other.

In certain embodiments, the reduction in volume of the material in the structure is 5% or more, or 10% or more, such as 15% or more, including 20% or more, or 25% or more, or 30% or more, such as 35% or more, or 40% or more, including 45% or more, for instance 50% or more, as compared to the volume of the material before being subjected to the conditions sufficient to cause the decrease in volume.

Sufficient conditions include reaction conditions that can induce a decrease in volume of at least a portion of at least one of the first material and the second material. In certain embodiments, sufficient conditions include subjecting the structure to a source of energy. The source of energy may include any energy sufficient to induce the decrease in volume of at least one of the first material and the second material. Examples of sources of energy include, but are not limited to, electromagnetic radiation, plasma, electricity, sound, combinations thereof, and the like. Electromagnetic radiation may include, but is not limited to, radio waves, microwaves, infrared radiation (e.g., heat energy), visible light, ultraviolet radiation, X-rays, gamma rays, and the like. In some cases, at least one of the first material and the second material includes a material that decreases in volume when exposed to a source of energy. For example, at least one of the first material and the second material may include a material that decreases in volume when exposed to electromagnetic radiation, such as, but not limited to, heat and/or light. As such, the method may include heating the structure to a temperature sufficient to cause at least one of the first layer and the second layer to decrease in volume. After sufficient heating, a gap may form between the first material and the second material as the surfaces of the first material and the second material that were contacting each other begin to move away from each other.

Aspects of the present disclosure also include methods for producing a gap between a first layer and a second layer of a multilayer structure. In certain embodiments, the method includes subjecting a multilayer structure that includes a first layer, a second layer and an intermediate layer positioned between the first layer and the second layer to conditions sufficient for at least a portion of the intermediate layer and the first layer to react to produce a product compound and a gap between the first layer and the second layer.

In certain embodiments, a gap can be formed using methods disclosed herein by decreasing the combined volume of an intermediate layer and a first layer, e.g., substrate layer. The layers of the multilayer structure may be arranged such that the layers overlay each other in a stacked vertical orientation. For example, the multilayer structure may include a first layer (e.g., a bottom substrate layer) with an intermediate layer disposed on a top surface of the first layer. The multilayer structure may also include a second layer (e.g., a top capping layer) disposed on a top surface of at least a portion of the intermediate layer and/or the first layer. In certain embodiments, the layers in the multilayer structure may be arranged such that the layers are adjacent each other in a laterally layered orientation. For example, the multilayer structure may include a first layer and an intermediate layer laterally adjacent the first layer. The multilayer structure may also include a second layer laterally adjacent the intermediate layer, such that the intermediate layer is positioned between the first layer and the second layer. Various combinations of the orientation of layers in the multilayer structure are possible. For example, a multilayer structure may include one or more of a stacked vertical arrangement of layers, a laterally layered arrangement of layers, or an arrangement of adjacent layers where the layers are at any desired angle with respect to the support or substrate on which the structure is disposed.

In certain embodiments, the multilayer structure is a micron-scaled structure. By "micron-scaled" is meant that one or more features of the multilayer structure have dimensions ranging from 1 µm to 1000 µm in size. For instance, micron-scaled features of the multilayer structure may have dimensions ranging from 1 µm to 1000 µm, such as from 1 µm to 750 µm, including from 1 µm to 500 µm, or from 1 µm to 350 µm, or 1 µm to 250 µm, or 1 µm to 100 µm. In certain cases, the multilayer structure is a nano-scaled structure. By "nano-scaled" is meant that one or more features of the multilayer structure have dimensions ranging from 1 nm to 1000 nm in size. For instance, nano-scaled features of the multilayer structure may have dimensions ranging from 1 nm to 1000 nm, such as from 1 nm to 750 nm, including from 1 nm to 500 nm, or from 1 nm to 350 nm, or 1 nm to 250 nm, or 1 nm to 100 nm.

Multilayer structures that may be used in the subject methods can include a plurality of layers, such as two or more, three or more, four or more, five or more, six or more, seven or more, eight or more, nine or more, or ten or more layers. Layers in the subject multilayer structures may include micron-scaled layers where the dimensions of the layer range from 1 µm to 1000 µm. For instance, the width of a layer may range from 1 µm to 1000 µm, such as from 1 µm to 750 µm, including from 1 µm to 500 µm, or from 1 µm to 250 µm, or 1 µm to 100 µm, or 1 µm to 50 µm or 1 µm to 25 µm, or 1 µm to 10 µm. In some cases, the length of a layer may range from 1 µm to 1000 µm, such as from 1 µm to 750 µm, including from 1 µm to 500 µm, or from 1 µm to 250 µm, or 1 µm to 100 µm, or 1 µm to 50 µm or 1 µm to 25 µm, or 1 µm to 10 µm. In certain instances, the thickness of a layer may range from 1 µm to 500 µm, or from 1 µm to 250 µm, or 1 µm to 100 µm, or 1 µm to 50 µm or 1 µm to 25 µm, or 1 µm to 10 µm, such as from 1 µm to 5 µm, including from 1 µm to 2 µm.

In certain embodiments, the layers in the subject multilayer structures may include nano-scaled layers, where the dimensions of the layer range from 1 nm to 1000 nm. For instance, the width of a layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm. In some cases, the length of a layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm. In certain instances, the thickness of a layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm, such as from 1 nm to 5 nm, including from 1 nm to 2 nm.

The layers in the multilayer structure may be disposed one over another such that a layer is disposed over at least a portion of the underlying layer. In some cases, the multilayer structure includes a first layer, an intermediate layer disposed on at least a portion of the first layer, and a second layer disposed on at least a portion of the intermediate layer, such that the intermediate layer is positioned between the first layer and the second layer. The multilayer structure is configured such that at least a portion of the intermediate layer reacts with the first layer when subjected to sufficient conditions, as described in more detail herein. The reaction of the intermediate layer with the first layer produces a product compound and a gap between the first layer and the second layer.

Layers used in multilayer structures of the present disclosure may include various materials. The materials that make up the layers may be materials useful in MEMS devices, NEMS devices, CMOS devices, and the like. For example, a layer may include a dielectric material, such as an oxide, glass, porcelain, plastic, and the like. In some instances, a layer includes an electrically conductive material, such as a metal, e.g., copper, aluminum, titanium, gold, silver, and the like. In certain cases, a layer includes a semi-conductive material, such as silicon, germanium, gallium arsenide, silicon carbide, and the like.

In some instances, the first layer is a substrate layer. By "substrate" is meant a material on which other materials are disposed or on which a process is performed. For instance, a substrate may support additional overlying layers and may form the base or bottom layer of a multilayer structure formed on the surface of the substrate. The substrate layer may include any material suitable for supporting a multilayer structure and undergoing a reaction as described herein. In some instances, the substrate layer includes a semi-conductive material as described above. In certain embodiments, the substrate layer includes a semi-conductive material such as silicon or a silicon-containing material. For example, the substrate may be a silicon substrate and may include silicon, such as single crystal silicon, polycrystalline silicon or amorphous silicon. In some instances, the substrate layer may include a silicon-containing compound, such as, but not limited to, SiGe, glass, CMOS substrates, and the like.

In certain embodiments, an intermediate layer is disposed over at least a portion of the first layer. The intermediate layer may be sized such that the intermediate layer covers a portion of the surface of the first layer and other portions of the surface of the first layer may not be covered by the intermediate layer. In some cases, the intermediate layer covers an area smaller than the surface of the first layer; leaving exposed portions of the surface of the first layer. In certain instances, the exposed portions of the surface of the first layer may be arranged peripherally around the intermediate layer. Deposition of the intermediate layer only on a portion of the surface of the first layer may facilitate attachment of other layers or structures to the exposed areas of the surface of the first layer. For example, the intermediate layer may be disposed over a portion of the first layer such that surfaces of the first layer peripherally surrounding the intermediate layer contact a layer other than the intermediate layer, such as the second layer, or a structural layer and the like.

The intermediate layer may be disposed directly on the first layer. In these cases, the intermediate layer is disposed directly on the surface of the first layer (e.g., the substrate) with no intervening layers or material between the first layer and the intermediate layer. In some instances, the method includes cleaning the surface of the first layer to remove any undesired layers or material on the surface of the first layer prior to depositing the intermediate layer on the first layer. In some instances, the surface of the first layer is cleaned such that the surface of the first layer is substantially free of any materials that would interfere with the deposition of the intermediate layer on the first layer or with the subsequent reaction between the intermediate layer and the first layer. For example, the intermediate layer may be disposed directly on the first layer, where the surface of the first layer is substantially free of interfering materials, such as impurities, oxides, dirt, undesired layers, and the like. An intermediate layer disposed directly on the first layer without substantially any interfering materials between the intermediate layer and the first layer may facilitate formation of a substantially uniform gap between the first layer and the second layer. For instance, an intermediate layer disposed substantially directly on the first layer may facilitate the formation of a gap having a substantially uniform distance between the first layer and the second layer.

In certain embodiments, the intermediate layer is deposited on the surface of the first layer without first treating the surface of the first layer to remove materials from the surface of the first layer. For example, in some cases, it may be desirable to have a first layer with a surface roughness greater than the surface roughness of a first layer that has been cleaned as described above. In these cases, the first layer may not be treated to remove material from the surface of the first layer, or the first layer may be treated using milder conditions. In certain instances, a first layer with having a surface roughness greater than the surface roughness of a first layer that has been cleaned as described above facilitates a reduction in stiction of undesired material to the surface of the first layer.

In some cases, the intermediate layer includes a material that reacts with the composition of the underlying silicon or silicon-containing substrate layer to form a product compound. In some embodiments, the reaction between the intermediate layer and the substrate layer forms chemical bonds between the intermediate layer and the substrate layer. For instance, the intermediate layer may include materials that form silicides with the underlying silicon or silicon-containing substrate layer. A silicide is a silicon-containing compound that has silicon chemically bonded to another element. In certain embodiments, the intermediate layer reacts with the substrate layer by annealing with the substrate layer. By "anneal" is meant that one compound or material reacts with another compound or material at an elevated temperature to form a product compound.

In certain embodiments, the intermediate layer includes the element that silicon forms a silicide with, such as an element that is more electropositive than silicon. In some cases, the intermediate layer includes a metal, such as a transition metal, a post-transition metal, an alkaline earth metal or an alkali metal, that is capable of forming a silicide with silicon. In some instances, the intermediate layer includes a transition metal, such as, but not limited to, Ni, Ti, Pt, Co, Mo, Fe, Zr, Hf, V, Cr, Mn, Cu, Ru, Rh, Ir, Y, combinations thereof, and the like. In some instances, the intermediate layer includes a post-transition metal, such as, but not limited to, Ge, Sn, Pb, combinations thereof, and the like.

In certain embodiments, the width of the intermediate layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm. In some cases, the length of the intermediate layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm. In certain instances, the thickness of the intermediate layer may range from 0.1 nm to 500 nm, or from 0.1 nm to 400 nm, or from 0.1 nm to 300 nm, such as from 0.1 nm to 200 nm, or 0.1 nm to 100 nm, or 0.1 nm to 50 nm or 0.1 nm to 25 nm, or 0.1 nm to 10 nm, such as from 0.1 nm to 5 nm, including from 0.1 nm to 2 nm, or from 0.1 nm to 1 nm.

In certain instances, the width and length of the intermediate layer are substantially the same, such that the intermediate layer has approximately a square shape when viewed from above (e.g., when viewing the multilayer structures from an angle looking down onto the top surface of the substrate layer). In other embodiments, the length and the width of the intermediate layer may be different. For instance, the length of the intermediate layer may be greater than the width of the intermediate layer, such that the intermediate layer has an elongated shape, e.g., in the shape of an elongated channel. The length of the intermediate layer may be 2 times or more the width of the intermediate layer, such as 5 times or more, including 10 times or more, or 25 times or more, or 50 time or more, or 100 times or more, for instance 200 times or more, or 500 times or more the width of the intermediate layer.

Other shapes for the intermediate layer are possible. In certain embodiments, the shape of the intermediate layer determines the shape of the gap, as the shape of the gap will be substantially the same as the shape of the intermediate layer. The shape of the intermediate layer can be modified by patterning the intermediate layer before reaction of the intermediate layer with the first layer to form the gap. Examples of intermediate layer shapes (e.g., when viewed from above) include, but are not limited to, square, elongated rectangle, circular, oval, L-shaped, U-shaped, H-shaped, comb-shaped, and the like.

In certain embodiments, the multilayer structures also include a second layer disposed over at least a portion of the intermediate layer. In certain instances, the second layer is disposed over the entire intermediate layer. For example, the second layer may substantially cover the top surface of the intermediate layer. In some instances, the second layer is disposed over a portion of the intermediate layer. In these cases, the second layer may be disposed over a portion of the intermediate layer such that one or more portions of the surface of the intermediate layer are exposed or contact another layer of the multilayer structure. In certain embodiments, one or more portions of the second layer extend over the edge of the intermediate layer and contact the first layer or another layer of the multilayer structure (e.g., a structural layer). The one or more portions of the second layer that extend over the edge of the intermediate layer and contact the first layer or another layer of the multilayer structure may provide one or more attachment points between the first layer and the second layer. Attachment points between the first layer and the second layer may facilitate maintaining the gap between the first layer and the second layer as the intermediate layer reacts with the first layer, such that undesired contact between the first layer and second layer is minimized.

In embodiments of micron-scaled devices, the second layer may be a micron-scaled layer that may be sized to substantially cover the surface of the intermediate layer as described above. In some cases, the dimensions of the second layer range from 1 µm to 1000 µm. For instance, the width of the second layer may range from 1 µm to 1000 µm, such as from 1 µm to 750 µm, including from 1 µm to 500 µm, or from 1 µm to 250 µm, or 1 µm to 100 µm, or 1 µm to 50 µm or 1 µm to 25 µm, or 1 µm to 10 µm. In some cases, the length of the second layer may range from 1 µm to 1000 µm, such as from 1 µm to 750 µm, including from 1 µm to 500 µm, or from 1 µm to 250 µm, or 1 µm to 100 µm, or 1 µm to 50 µm or 1 µm to 25 µm, or 1 µm to 10 µm. In certain instances, the thickness of the second layer may range from 1 µm to 500 µm, or from 1 µm to 250 µm, or 1 µm to 100 µm, or 1 µm to 50 µm or 1 µm to 25 µm, or 1 µm to 10 µm, such as from 1 µm to 5 µm, including from 1 µm to 2 µm.

In embodiments of nano-scaled devices, the second layer may be nano-scaled in size. In some cases, the dimensions of the second layer range from 1 nm to 1000 nm. For instance, the width of the second layer may range from 1 nm to 1000 nm, such as from 1 nm to 750 nm, including from 1 nm to 500 nm, or from 1 nm to 250 nm, or 1 nm to 100 nm, or 1 nm to 25 nm, or 1 nm to 10 nm. In some cases, the length of the second layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm. In certain instances, the thickness of the second layer may range from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm, such as from 1 nm to 5 nm, including from 1 nm to 2 nm.

The second layer may include various materials useful in the fabrication of multilayer structures, such as MEMS devices and NEMS devices. In certain embodiments, the second layer includes materials that do not substantially undergo a silicidation reaction, such as an oxide, a nitride, or combinations thereof. For example, the second layer may include silicon dioxide or silicon nitride. In some cases, the second layer includes a material that is capable of reacting with the underlying intermediate layer to form a silicide. For example, the second layer may include silicon, such as single-crystal silicon, polycrystalline silicon, amorphous silicon, and the like. In certain instances, the second layer may include structural materials that form part of the structure of the multilayer structure. For instance, the second layer may include a metal, such as Ti, Au, Ag, Al, and the like. In certain embodiments, the second layer includes a capping material or a dielectric material. By "capping layer" is meant an outer layer that substantially seals the multilayer structure from the surrounding environment. Capping layers may include materials, such as silicon carbide, diamond, an oxide, a nitride, and the like.

Other layers may be included in the multilayer structures as desired. For example, the multilayer structures may include dielectric layers, oxide layers, conductive layers, structural layers, and the like.

Methods for producing a gap between a first layer and a second layer of a multilayer structure are based on a reaction between the intermediate layer and the first layer to produce a product compound. The reaction may include annealing the intermediate layer with the first layer, as described above. In certain embodiments, the reaction comprises silicidation, whereby silicon reacts under elevated temperatures with a metal to form a silicide.

In some instances, the methods are self-sufficient. By "self-sufficient" is meant that all the reactants necessary for the reaction between the intermediate layer and the first layer are provided on the substrate and all of the products of the reaction remain on the substrate. In certain embodiments, the self-sufficient reaction used to form the gap between two layers of a multilayer structure only requires an intermediate layer, such as a metal, disposed on a first layer, such as a silicon or silicon-containing substrate. For example, reaction between the metal layer and the silicon substrate may occur when the multilayer structure is exposed to elevated temperatures. In certain cases, no other reactants, catalysts, solvents, etc. are required for the reaction between the metal layer and the silicon substrate to occur.

Activation of the reaction between the intermediate layer and the first layer may occur when the multilayer structure is exposed to a source of energy. The source of energy may include any energy sufficient to induce a decrease in volume one or more of the layers of the multilayer structure such that a gap is produced between the first layer and the second layer of the multilayer structure. Examples of sources of energy include, but are not limited to, electromagnetic radiation, plasma, electricity, sound, combinations thereof, and the like. Electromagnetic radiation may include, but is not limited to, radio waves, microwaves, infrared radiation (e.g., heat energy), visible light, ultraviolet radiation, X-rays, gamma rays, and the like.

In certain embodiments, activation of the reaction between the intermediate layer and the first layer occurs when the structure is heated. For example, the reaction between the intermediate layer and the first layer may occur in temperature ranges from 150° C. to 1000° C., such as from 200° C. to 900° C., including from 250° C. to 850° C. The reaction temperature may depend on the type of metal used in the intermediate layer, the type of silicon used in the substrate layer, and on the structure of the silicide formed.

In certain embodiments, the method of producing a gap between two layers of a multilayer structure includes subjecting the structure to reaction conditions for a time that is less than the amount of time required to form a similar sized gap using an etching method. The time needed to produce a gap according to embodiments of the subject methods may be less than the time required to produce a similar gap using etching techniques because, in some embodiments, the reaction between the intermediate layer and the substrate depends on the degree of contact at the interface between the intermediate layer and the substrate, and does not depend on the rate of diffusion of etchant to a substrate surface or the rate of diffusion of etching byproducts away from the substrate surface. In some cases, the method includes subjecting the structure to reaction conditions for a time of 10 minutes or less, such as 7 minutes or less, including 5 minutes or less, or 3 minutes or less, or 2 minutes or less, or 1 minute or less, for instance 30 seconds or less.

Selection of various parameters for the reaction conditions above, such as the reaction temperature, the length of the reaction time, the type of intermediate layer material used, and the type of substrate material used can influence the percent decrease in the combined volume of the product compound and remaining substrate layer after the reaction, as compared to the combined volume of the starting substrate layer and intermediate layer. As such, these parameters also affect the size of the gap formed between the first layer and the second layer. For example, an intermediate layer of metal having a thickness, N, may form a gap with a thickness of N×δ, where the values for δ for various different silicides are given in Table 1 below.

Table 1 lists properties of certain silicides that may be employed in the subject methods.

TABLE 1

Properties of Silicides

| Silicide | Silicidation Temperature | $t_{Si}$ | $t_{sili}$ | Decrease in Volume | δ |
|---|---|---|---|---|---|
| Ni$_2$Si | ~250° C. | 0.91 | 1.47 | 23.0% | 0.44 |
| NiSi | ~400° C. | 1.84 | 2.22 | 21.8% | 0.62 |
| TiSi$_2$ | ~850° C. | 2.30 | 2.50 | 24.1% | 0.8 |
| PtSi | ~500° C. | 1.30 | 1.95 | 15.1% | 0.35 |
| CoSi$_2$ | ~750° C. | 3.60 | 3.53 | 23.2% | 1.07 |
| MoSi$_2$ | ~750° C. | 2.56 | 2.59 | 27.25% | 0.97 |

$t_{si}$ = nm of Si consumed per nm of metal ($t_m$ = 1)
$t_{sili}$ = nm of silicide formed per nm of metal ($t_m$ = 1)
δ = nm of step height change per nm of metal ($t_m$ = 1)

For example, using the values in Table 1, silicidation can be used to form a gap between two layers in a multilayer structure. If 10 nm of molybdenum (Mo) was sandwiched between a silicon (Si) substrate below and a capping layer of oxide above, then upon heating via rapid thermal annealing in a low oxygen environment, the Mo and Si react to form MoSi$_2$, whereby 10×2.56=25.6 nm of silicon is consumed to form 10×2.59=25.9 nm of MoSi$_2$. This means the step height changes from the 10 nm original metal thickness to 25.9−25.6=0.3 nm, leaving a 10−0.3=9.7 nm gap between the top of the silicide and the bottom of the oxide capping layer.

In certain embodiments, as the intermediate layer reacts with the first layer, the intermediate layer and resulting product compound may no longer be in contact with the overlying second layer. As the reaction between the intermediate layer and the first layer progresses, the distance between the intermediate layer and the second layer may increase, thus forming a gap between the first layer and the second layer. In addition, as a portion of the first layer reacts with the intermediate layer, a well or depression may be formed in the first layer, which is filled by the resulting product compound.

In some instances, substantially all of the intermediate layer reacts with a portion of the first layer, such that substantially none of the intermediate layer remains after the reaction with the first layer. The reaction between the intermediate layer and the first layer results in a product compound, where the combined volume of the product compound and the remaining first layer is less than the combined volume of the intermediate layer and the first layer before the reaction. In some cases, this reduction in volume from the starting intermediate layer and the first layer to the resulting product compound and remaining first layer results in the formation of a gap between the first layer and the second layer.

In certain embodiments, the gap has a height (e.g., the distance between the two layers of the multilayer structure) ranging from 0.1 nm to 1000 nm, such as from 0.1 nm to 750 nm, including from 0.2 nm to 500 nm, for instance, from 0.5 nm to 400 nm, or from 0.5 nm to 300 nm, or 0.5 nm to 200 nm, or 0.5 nm to 100 nm, or 0.5 nm to 50 nm, such as 0.5 nm to 25 nm, including from 0.5 nm to 10 nm. In certain embodiments, the gap formed between two layers of the multilayer structure is 1000 nm or less, such as 800 nm or less, including 600 nm or less, or 400 nm or less, or 200 nm or less, such as 150 nm or less, or 100 nm or less, for instance 50 nm or less, or 25 nm or less, or 10 nm or less, including 5 nm or less, or 3 nm or less, or 2 nm or less, such as 1 nm or less. In some instances, the gap formed between two layers of the multilayer structure is 50 nm or less.

In certain embodiments, the gap has a width ranging from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm. In some cases, the gap has a length ranging from 1 nm to 1000 nm, such as from 1 nm to 750 nm, including from 1 nm to 500 nm, or from 1 nm to 250 nm, or 1 nm to 100 nm, or 1 nm to 50 nm or 1 nm to 25 nm, or 1 nm to 10 nm.

In certain instances, the width and length of the gap are substantially the same, such that the gap has approximately a square shape when viewed from above (e.g., when viewing the multilayer structures from an angle looking down onto the top surface of the substrate layer). In other embodiments, the length and the width of the gap may be different. For instance, the length of the gap may be greater than the width of the gap, such that the gap has an elongated shape, e.g., in the shape of an elongated channel. The length of the gap may be 2 times or more the width of the gap, such as 5 times or more, including 10 times or more, or 25 times or more, or 50 time or more, or 100 times or more, for instance 200 times or more, or 500 times or more the width of the gap.

Other shapes for the gap are possible. In certain embodiments, the shape of the gap depends on the shape of the intermediate layer, as the shape of the gap will be substantially the same as the shape of the intermediate layer. Thus, the shape of the gap can be determined by patterning the intermediate layer before reaction of the intermediate layer with the first layer to form the gap. Examples of gap shapes (e.g., when viewed from above) include, but are not limited to, channels, square, rectangle, circular, oval, L-shaped, U-shaped, H-shaped, comb-shaped, and the like.

FIG. 1 illustrates a process flow schematic showing the reaction between an intermediate layer and a first layer (the second layer is omitted for clarity). Referring to FIG. 1, the intermediate layer, e.g., metal layer 10, is disposed on the surface of the first layer, e.g., silicon substrate 20. The metal layer 10 may be disposed on the surface of the first layer using techniques suitable for the deposition of thin layers onto a substrate, as described in more detail below. The metal layer 10 has a thickness, $t_m$. The metal layer 10 reacts, e.g., anneals, with the silicon substrate 20 to form a product compound, silicide 30. The silicide 30 has a thickness, $t_{sili}$. During the reaction, the metal layer 10 reacts with a portion of the silicon substrate 20 to form the silicide 30, leaving the remaining silicon substrate 40. The portion of the silicon substrate 20 consumed in the reaction is measured as $t_{si}$ in FIG. 1. As shown in FIG. 1, the combined volume of the silicide 30 and the remaining silicon substrate 40 is less than the combined volume of the metal layer 10 and the starting silicon substrate 20. This reduction in volume results in the formation of a gap, $\delta$, between the silicide 30 and the second layer (not shown).

In certain embodiments, the reduction in volume from the combined volume of the metal layer 10 and the starting silicon substrate 20 to the combined volume of the silicide 30 and the remaining silicon substrate 40 is 10% or more, such as 15% or more, including 20% or more, or 25% or more, or 30% or more, such as 35% or more, or 40% or more, including 45% or more, for instance 50% or more. In some cases, the reduction in volume from the combined volume of the metal layer 10 and the starting silicon substrate 20 to the combined volume of the silicide 30 and the remaining silicon substrate 40 ranges from 10% to 50%, such as from 15% to 40%, including from 15% to 30%.

Figure 9:
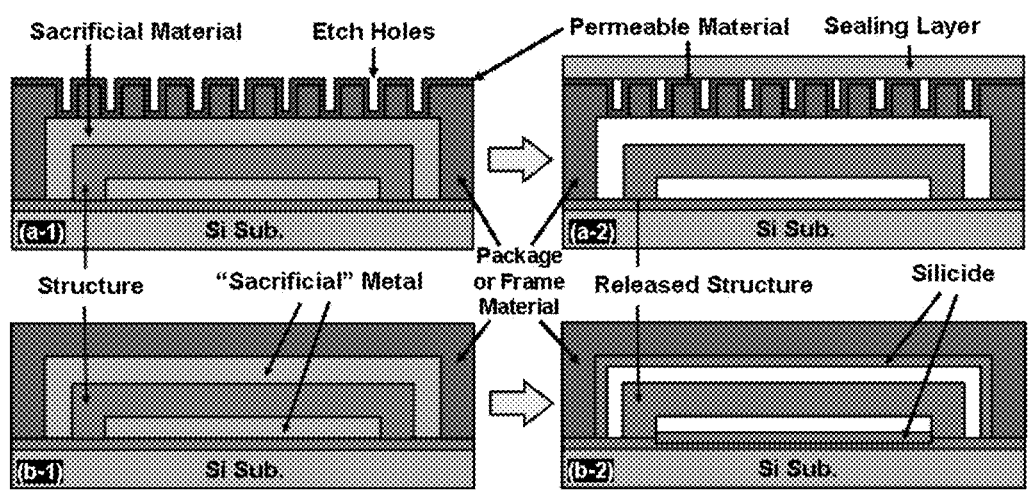
FIG. 9 shows cross-sectional process flow schematics of a conventional thin-film package where (a-1) etch holes provide access for sacrificial material removal and (a-2) a deposition step is required to seal; and an etchant-free silicide-based release packaging method that obviates the need for etch holes and sealing that includes (b-1) deposition and patterning of a multilayer structure of semi-conductors and metals and (b-2) a silicidation anneal, according to embodiments of the present disclosure.

FIGS. 9(a-1) and 9(a-2) present a process flow schematic for a conventional approach to wafer-level encapsulation where release holes in the encapsulating cap are needed to allow etchants to access a sacrificial layer that completely encases the structure under the cap. Since the diffusion paths are tortuous, the time required for release is long (e.g., 40 minutes or more) and etch byproducts diffuse away from the substrate slowly. In addition, the etch holes must be sealed after the etching step, which can compromise both the package and device within if the sealant also deposits on the device. In contrast, the silicidation reaction requires no diffusion paths for etchants and forms gaps between layers of the multilayer structure, as shown in FIGS. 9(b-1) and 9(b-2).

Methods according to aspects of the present disclosure may be configured to form high aspect ratio gaps between structures without employing etching. The aspect ratio of a gap is a lateral dimension of the gap divided by the gap thickness. For example, a gap with a width of 1 mm wide and a height of 1 µm has an aspect ratio of 1000:1 (e.g., 1000 µm width:1 µm height=1000:1 aspect ratio). In certain embodiments, the gap formed by the subject methods has an aspect ratio of 15:1 or more, such as 20:1 or more, or 25:1 or more, including 50:1 or more, or 100:1 or more, or 150:1 or more, or 200:1 or more, or 250:1 or more, such as 300:1 or more, including 400:1 or more, for instance 500:1 or more, or 750:1 or more, or 1000:1 or more, or 1500:1 or more, or 2000:1 or more, such as 3000:1 or more, including 4000:1 or more, for instance 5000:1 or more. In some cases, the gap formed by the subject methods has an aspect ratio of 250:1 or more.

Aspects of the subject methods include specific reaction between the intermediate layer and the first layer (e.g., the substrate layer). By "specific reaction" or "specifically reacts" is meant that a particular first reagent will only substantially react with a particular second reagent, and will not substantially react with other reagents that may be present. For example, the intermediate layer may specifically react with the substrate layer with substantially no reaction between the intermediate layer and other layers of the multilayer structure, such as the second layer, oxide layers, nitride layers, structural layers, and the like. Specific reaction between the intermediate layer and the substrate layer may facilitate a minimization in damage to surrounding structures not involved in formation of the gap between the first layer and the second layer of the multilayer structure.

Methods of making the multilayer structures used in the above methods are also provided. The method of making the multilayer structure may include providing a first layer, such as a substrate layer. In certain embodiments, the method includes depositing an intermediate layer on a surface of the first layer and depositing a second layer on at least a portion of the intermediate layer. The intermediate layer may be deposited on the first layer using any convenient technique suitable for the deposition of thin layers onto a substrate. For example, the intermediate layer may be deposited on the first layer by thin film deposition, such as, but not limited to, chemical deposition (e.g., chemical vapor deposition, plasma enhanced chemical vapor deposition, etc.), physical deposition (e.g., sputtering, cathodic arc deposition, etc.), combinations thereof and the like. Similarly, deposition of the second layer on at least a portion of the intermediate layer may be achieved using any convenient technique suitable for the deposition of thin layers onto a substrate as described above.

In certain embodiments, prior to depositing the intermediate layer on the surface of the first layer, the method of making the multilayer structure includes removing oxide from the surface of the first layer. In some instances, removing oxide from the surface of the first layer includes processing the surface of the first layer by, for example, contacting the surface of the first layer with an acid, in situ sputter etching the surface of the first layer, combinations thereof and the like. In certain cases, the acid used for removing oxide from the surface of the first layer includes, but is not limited to, hydrofluoric acid (HF), buffered hydrofluoric acid (BHF), nitric acid ($HNO_3$), acetic acid ($CH_3COOH$), combinations thereof, and the like. Removing oxide from the surface of the first layer prior to depositing the intermediate layer on the first layer may facilitate contact between the intermediate layer and the first layer at their interface. This, in turn, may facilitate a maximization in the uniformity of the formation of the product compound when the intermediate layer reacts with the first layer, and correspondingly may facilitate a maximization in the uniformity of the gap formed between the first layer and the second layer.

In some cases, after the multilayer structure is formed, but prior to formation of the gap between two layers of a multilayer structure, the multilayer structure is covered with a sealing layer that substantially isolates the multilayer structure from the surrounding environment. As such, methods of making the multilayer structure may include depositing a sealing layer over the multilayer structure. The multilayer structure may be contacted with the sealing layer prior to subjecting the multilayer structure to conditions sufficient for the intermediate layer to react with the first layer to produce a product compound and a gap between the first layer and the second layer, as described herein.

Capacitive Piezoelectric Transducer

Aspects of the present disclosure include a method of making a capacitive piezoelectric transducer. In some cases, the capacitive piezoelectric transducer may be made using embodiments of the methods described above. As described in more detail below, the capacitive piezoelectric transducer may include one or more gaps between a piezoelectric body (e.g., a piezoelectric layer) and the electrode (e.g., the first electrode and the second electrode). As such, the first electrode may be spaced a distance apart from the piezoelectric body, and the second electrode may be spaced a distance apart from the piezoelectric body. In some instances, the gaps between the piezoelectric body and the electrodes (e.g., the first and second electrodes) may be formed using embodiments of the methods described above.

For example, a capacitive piezoelectric transducer may be produced by a method that includes providing a layered substrate and releasing a piezoelectric layer, such that a first electrode is spaced apart from a piezoelectric body by a first distance and a second electrode is spaced apart from the piezoelectric body by a second distance. The layered substrate may include a base layer, a first electrode disposed on the base layer, a first layer disposed on the first electrode, a piezoelectric layer disposed on the first layer, a second layer disposed on the piezoelectric layer, and a second electrode disposed on the second layer. As described above, the capacitive piezoelectric transducer may be produced using the etchant-free methods of producing a gap between two materials.

In certain embodiments, the step of releasing the piezoelectric layer from the electrodes may include subjecting the layered substrate to conditions sufficient for at least a portion of the first layer and the first electrode to react to produce a first product compound and a first gap between the first electrode and the piezoelectric body, and for at least a portion of the second layer and the second electrode to react to produce a second product compound and a second gap between the second electrode and the piezoelectric layer. For instance, the first layer between the first electrode and the piezoelectric layer may be an intermediate layer as described above. The second layer between the second electrode and the piezoelectric layer may be an intermediate layer as described above. In certain embodiments, the subjecting step includes subjecting the layered substrate to electromagnetic radiation, as described above.

In other embodiments, the capacitive piezoelectric transducer is produced using methods that may include etching. For example, the electrodes may be released from the piezoelectric body by removing the first layer from between the first electrode and the piezoelectric layer and the second layer from between the piezoelectric layer and the second electrode. In certain instances, the removing may include etching the first and second layers.

Devices

Aspects of the present disclosure include devices produced by the methods as described herein. In certain embodiments, the device includes micron-scaled structures. In these embodiments, the device may be a microelectromechanical system (MEMS) device. For example, micron-scaled structure of a MEMS device may have dimensions ranging from 1 µm to 1000 µm, such as from 1 µm to 750 µm, including from 1 µm to 500 µm, or from 1 µm to 350 µm, or 1 µm to 250 µm, or 1 µm to 100 µm. In some instances, the device includes nano-scaled structures. In these instances, the device may be a nanoelectromechanical system (NEMS) device. For example, nano-scaled structures of a NEMS device may have dimensions ranging from 1 nm to 1000 nm in size, such as from 1 nm to 750 nm, including from 1 nm to 500 nm, or from 1 nm to 350 nm, or 1 nm to 250 nm, or 1 nm to 100 nm.

As described above, the method of producing a gap between two layers of a multilayer structure is an etchless or etchant-free method. As such, in certain embodiments, a device produced by the methods described herein does not include structural features that facilitate etching. For example, the device may not include conduits (e.g., access routes, etch holes, etc.) configured to facilitate the diffusion of etchant to the substrate surface or the diffusion of etching byproducts away from the substrate surface. In some instances, the device includes a substantially sealed chamber surrounding the multilayer structure. For example, a sealing layer may be deposited over the multilayer structure, where the sealing layer substantially prevents the multilayer structure from contacting the surrounding environment. In some cases, the gap is formed between two layers of a multilayer structure while the multilayer structure is within the substantially sealed chamber.

Devices may include either movable or immovable structures. In some instances, the second layer is attached to the first layer at one or more attachment points. The second layer may be directly attached to the first layer, or indirectly attached to the first layer through other structural layers. For example, the second layer may be attached to the first layer at one attachment point, such that one end of the second layer is attached to the first layer and an opposite end of the second layer is not attached to the first layer, such that the first layer and the second layer form a cantilever structure. The second layer may be displaced relative to the first layer, such that the distance between the first layer and the second layer may change. In another example of a movable structure, the second layer may be attached to the first layer along the periphery of the second layer, such that at least a portion of the edges of the second layer are attached to the first layer, such that the first layer and the second layer form a diaphragm structure. The second layer may be displaced relative to the first layer, such that the distance between the first layer and the second layer may change. In other embodiments, the second layer is rigidly attached to the first layer, such that the second layer does not substantially move relative to the first layer.

Capacitive Piezoelectric Transducer

In certain embodiments, the device is a capacitive piezoelectric transducer. The capacitive piezoelectric transducer includes layered structure that includes a piezoelectric body (e.g., a piezoelectric layer) and one or more electrodes. For example, the capacitive piezoelectric transducer may include a piezoelectric body, a first electrode, and a second electrode. In some cases, the first electrode is arranged proximal to a first side of the piezoelectric body and the second electrode is arranged proximal to a second side of the piezoelectric body. In these embodiments, the first and second electrodes are arranged on opposing sides of the piezoelectric body.

In some instances, the first electrode is arranged proximal to a first side of the piezoelectric body, where the first electrode is spaced apart from the piezoelectric body by a first distance. In certain embodiments, the distance between the first electrode and piezoelectric body is 100 nm or less, such as 75 nm or less, or 50 nm or less, or 40 nm or less, or 30 nm or less, or 25 nm or less. In some cases, the second electrode arranged proximal to a second side of the piezoelectric body, where the second electrode is spaced apart from the piezoelectric body by a second distance. In certain embodiments, the distance between the second electrode and piezoelectric body is 100 nm or less, such as 75 nm or less, or 50 nm or less, or 40 nm or less, or 30 nm or less, or 25 nm or less.

The piezoelectric body can include a piezoelectric material, such as, but not limited to zinc oxide (ZnO), aluminum nitride (AlN), gallium nitride (GaN), lead zirconate titanate (PZT), combinations thereof, and the like. The electrode may be made of an electrically conductive material, such as a metal, e.g., copper, aluminum, titanium, gold, silver, and the like. In certain cases, the electrode may include a semi-conductive material, such as silicon, germanium, gallium arsenide, silicon carbide, and the like.

Figure 16:
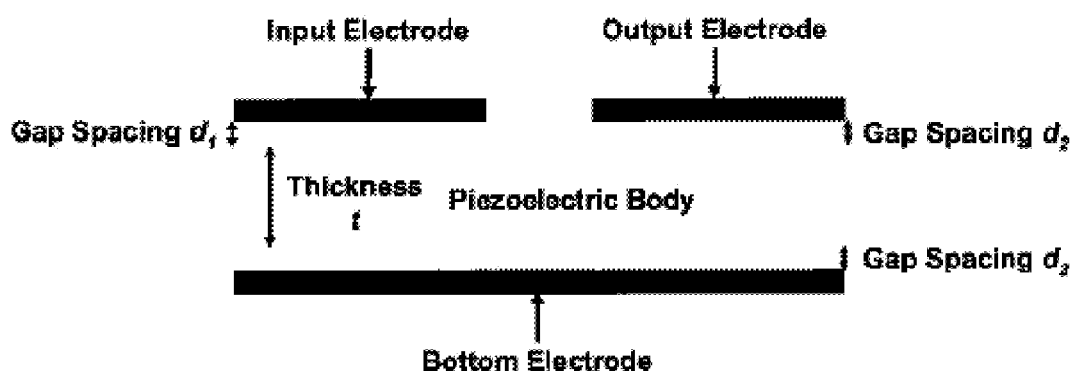
FIG. 16 shows an embodiment of a device using a capacitive piezoelectric transducer according to embodiments of the present disclosure.

In certain embodiments, a capacitive piezoelectric transducer includes small air-gaps (or vacuum gaps) between the piezoelectric body and its conductive electrodes, as shown in FIG. 16. In some cases, the piezoelectric body may have different geometries, such as, but not limited to a cantilever, bar, cylinder, disk, ring, membrane, etc. In some instances, the piezoelectric resonator is separated from its electrodes, which then eliminates interface dissipation In some instances, the capacitive piezoelectric transducer has a quality factor (Q) of 2,000 or more, or 3,000 or more, or 4,000 or more, or 5,000 or more, such as 7,500 or more, or 10,000 or more, or 15,000 or more, or 20,000 or more, or 25,000 or more, or 30,000 or more, or 40,000 or more, or 50,000 or more. In certain instances, capacitive piezoelectric transduction as described above further avoids nonlinearity, since it is mainly the piezoelectric effect that governs the currents generated, and reduces the tradeoff between resistance and mass loading for scaled devices.

In some cases, a capacitive piezoelectric transducer with air-gaps facilitates a minimization in energy dissipation at the interface between the piezoelectric body and its electrodes, and within its electrodes. In certain instances, the electromechanical coupling coefficient of a piezoelectric transducer can be expressed as the amount of strain induced in the piezoelectric body when a unit voltage is applied to the transducer. In some cases, the strain induced is proportional to the electric field applied across the piezoelectric body. Assuming metal electrodes are used, that there are substantially no voltage drops across electrodes, and that both piezoelectric bodies have the same material properties and thickness t, the electrical field across the piezoelectric body (ignoring fringing fields) may be represented by the formula:

$$E = \frac{V\varepsilon_o A}{t + \varepsilon_r(d_{1,2} + d_3)}$$

Where A is the overlap area of the top and bottom electrodes and $\delta_r$ is the relative permittivity of the piezoelectric material in thickness direction. When $\varepsilon_r(d_{1,2}+d_3)$ is much smaller than t, or equivalently, the capacitance associated with piezoelectric body is much smaller than that of the air-gaps, the above equation can be approximated by the following equation:

$$E = \frac{V\varepsilon_o A}{t}$$

For example, for an embodiment as shown in FIG. 16 with a 1.5 μm aluminum nitride thin film and with electrode-to-film air-gap spacings all equal to 80 nm, the electric field, and thus electromechanical coupling coefficient is two times smaller than an embodiment that does not have gaps between the electrodes and the piezoelectric body.

In certain embodiments, if the piezoelectric body as shown in FIG. 16 is poled in the thickness direction and excited in lateral mode, i.e., with lateral displacement, the gap-spacing is not modulated by displacement as in the case of a typical gap-less capacitive transducer, for which case linearity decreases as gap spacing decreases.

In some instances, as described above, gaps separate the electrodes from the piezoelectric body. In these embodiments, the electrodes have a reduced mass loading to the piezoelectric body and may have a greater thickness than typical piezoelectric electrodes. In some embodiments, the electrode may have a thickness of 3 μm or less, such as 2.5 μm or less, or 2 μm or less, or 1.5 μm or less, or 1 μm or less, or 0.5 μm or less, or 0.25 μm or less, or 0.01 μm or less. For example, the electrode may have a thickness of 500 nm, or 400 nm, or 300 nm, etc.

In certain embodiments, the piezoelectric body (e.g., the piezoelectric layer) has a thickness of 5 μm or less, such as 4.5 μm or less, including 4 μm or less, or 3.5 μm or less, or 3 μm or less, of 2.5 μm or less, or 2 μm or less, or 1.5 μm or less, or 1 μm or less, or 0.5 μm or less. For instance, the piezoelectric body may have a thickness of 1.5 μm.

In certain instances, the stroke force of a piezoelectric lateral actuator for in-plane actuation may be increased by increasing the quality factor of the actuator. In some cases, a capacitive piezoelectric transducer may be used for frequency selection and control devices, such as filters and oscillators, for example as used in a modem. Electronics equipment and wireless communication systems may include resonators with high quality factor and high micromechanical coupling coefficient for impedance matching. Capacitive piezoelectric transducers may also be used in piezoelectric resonators, such as, but not limited to, surface acoustic wave (SAW), bulk acoustic wave (BAR), film bulk acoustic wave (FBAR), and thin-film bulk acoustic wave (TFBAR). For example, a capacitive piezoelectric transducer may facilitate simultaneous high-Q and low-impedance micromechanical piezoelectric resonators that may be used in electronic equipment and wireless communication systems.

Figure 17:
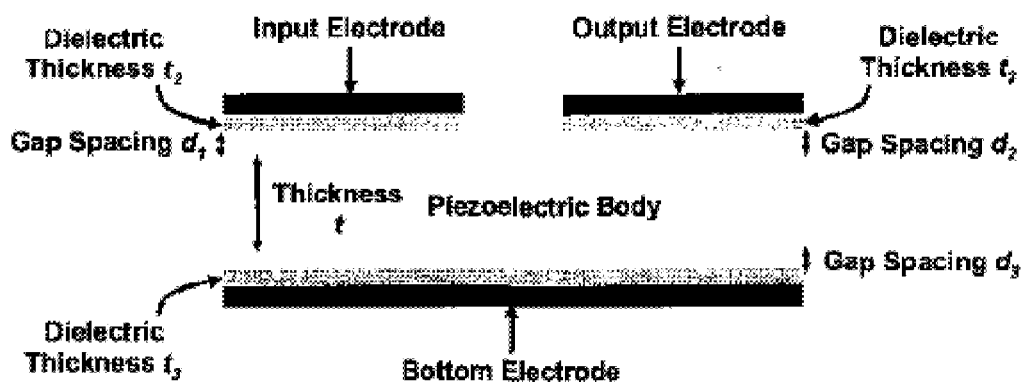
FIG. 17 shows a schematic of a piezoelectric transducer with a dielectric material between the electrodes and the piezoelectric body, according to embodiments of the present disclosure.
Figure 18:
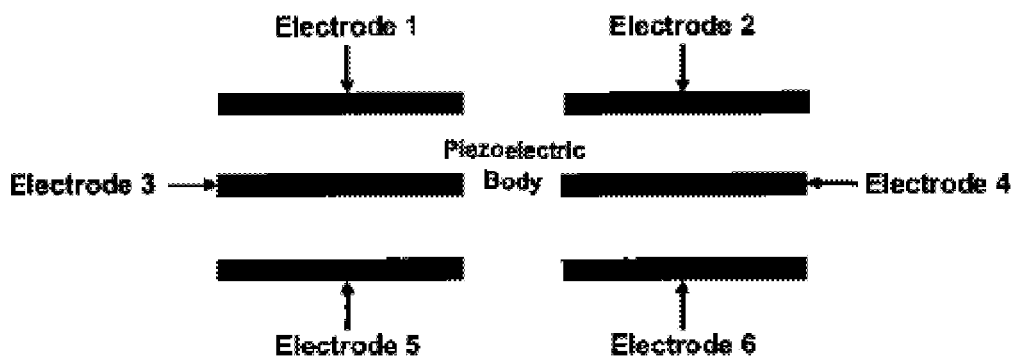
FIG. 18 shows a piezoelectric transducer with electrodes positioned inside the piezoelectric body, according to embodiments of the present disclosure.

In certain embodiments, the capacitance between the electrodes may be varied. For example, the gaps can be partially filled with dielectric, as shown in FIG. 17. In other embodiments, the electrodes may be provided in a piezoelectric body as shown in FIG. 18. For example, this structure may be useful for exciting and sensing higher modes of the resonant body.

Systems

Systems for producing a gap between a first layer and a second layer of a multilayer structure are provided. In certain embodiments, the system is configured to produce the gap by heating the multilayer structure to a temperature sufficient for the intermediate layer to react with the first layer to produce a product compound and the gap between the first layer and the second layer. As such, the system may include a heater. In some cases, the system includes a laser, where the multilayer structure may be heated by contacting the multilayer structure with the laser.

As described above, the method of producing a gap between two layers of a multilayer structure is an etchless or etchant-free method. As such, in certain embodiments, the system does not include elements associated with an etching process, such as, but not limited to, devices for producing or handling etchants, including gaseous, fluid and plasma etchants. The system may also not include components for directing etchants to and for directing etching byproducts away from the multilayer structure. For example, the system may not include reservoirs for storing an etchant, conduits for directing an etchant to the multilayer structure or conduits for directing etching byproducts away from the multilayer structure.

Other system components associated with the production of MEMS and/or NEMS devices may be included in the system as desired. For example, the system may include thin layer deposition devices, vacuum sources, etc.

Utility

The methods and systems as described herein find use in a variety of devices that include components fabricated to have a gap between a first layer and a second layer of a multilayer structure. For example, the subject methods and systems find use in producing a variety of structures that can be used in MEMS and/or NEMS devices. Examples of the types of devices that include micron-scaled and/or nano-scaled structures produced using the subject methods and systems include telecommunications devices. For example, optical switching components used in cellular or wireless network devices may include resonators produced by the subject methods and systems, such as, but not limited to, beam resonators, clamp-clamp beam resonators, vibrating RF resonators, capacitively transduced resonators (e.g., capacitively transduced resonators with sub-50Ω impedance), GHz high-Q mechanical resonators, and the like. Cellular telephones may include sensors produced by the subject methods and systems, such as, but not limited to, inertial sensors, pressure sensors, accelerometers, gyroscopes, antennas, and the like.

Other types of devices that may include micron-scaled and/or nano-scaled components fabricated using the subject methods and systems include consumer electronic devices. For example, displays (e.g., MEMS displays), computer chipsets, memory (e.g., volatile and non-volatile memory) may include resonators, capacitors, logic gates, cantilevers, actuators, and the like. Thermal inkjet printers and piezoelectric inkjet printers may include diaphragms, cantilevers and/or actuators in ink deposition apparatuses. Inkjet printers may also include timing devices based on MEMS or NEMS resonators produced using the subject methods and systems. In some cases, videogame controllers can include sensors, such as force sensors, pressure sensors, accelerometers, gyroscopes, antennas, and the like.

For example, MEMS displays may include optical switching components (e.g., transmissive micro-optical switches), thermomechanical actuators, electrostatic actuators, etc. produced using the subject methods and systems. Further examples of components for use in MEMS displays are described in U.S. Pat. Nos. 7,872,792, 7,864,402, 7,379,227; 6,867,896; 6,674,562.

The subject methods and systems may also find use in the fabrication of components for medical devices. For example, blood pressure sensors may use pressure sensors produced by the subject methods and systems. Fluidic devices may include microchannels and/or nanochannels produced by the subject methods and systems.

The methods, devices and systems as described herein also find use in the formation of air gaps as low-k dielectrics. Air gaps as low-k dielectrics may be used for fast switching in microelectronics or nanoelectronics. Air gaps as low-k dielectrics may facilitate a minimization in parasitic capacitance. Formation of air gaps as low-k dielectrics between interconnects may be performed as the final fabrication step, which may minimize the exposure of the air gap to mechanical forces from chemical-mechanical polishing, bonding, and/or packaging. For example, microwave annealing may be used to form silicides at temperatures of 200° C. or less.

The methods, devices and systems as described herein also find use in electronically programmable fuses. Rather than using conventional techniques, such as evaporation or electromigration, gaps may be formed via silicidation, which in some instances allows for lower reaction temperatures and lower power consumption as compared to conventional techniques. For example, re-routing of a circuit may be performed by electronically programmable fuses using silicidation gap formation. Electronically programmable fuses may be used in self-healing chips, which may extend usage time for the chips and reduce product testing costs.

In some cases, a capacitive piezoelectric transducer as described herein finds use in devices, such as, but not limited to, actuators, sensors, and resonators (e.g., a high-frequency micromechanical resonator). For example, a capacitive piezoelectric transducer may be used in a magnetic sensor that uses piezoelectric vibrations. In some cases, for the same applied magnetic, the voltage generated due to electromagnetic induction is proportional to the vibrating velocity of the resonator, which is further proportional to the resonant frequency and quality factor for the same actuation power. Stated another way, a capacitive piezoelectric transducer as described herein may facilitate an increase in sensitivity for the same power consumption.

In certain cases, a capacitive piezoelectric transducer may be used in a tactile sensor, a gas sensor, a chemical sensor, a mass sensor, and the like, where piezoelectric resonators are configured to have a frequency shift proportional to the signal to be sensed. In certain instances, the minimum detectable signal (resolution of the sensor) may depend on the minimum detectable frequency shift of the resonator, which further depends on its quality factor. In some cases, the higher the quality factor, the more stable the resonator and thus the more sensitive the sensor is. As such, embodiments of the capacitive piezoelectric transducer that have high Q values, as described above, may find use in facilitating in increase in the sensitivity of a sensor.

The following examples are put forth so as to provide those of ordinary skill in the art with a complete disclosure and description of how to make and use the embodiments of the invention, and are not intended to limit the scope of what the inventors regard as their invention nor are they intended to represent that the experiments below are all or the only experiments performed. Efforts have been made to ensure accuracy with respect to numbers used (e.g., amounts, temperature, etc.) but some experimental errors and deviations should be accounted for. Unless indicated otherwise, parts are parts by weight, molecular weight is weight average molecular weight, temperature is in degrees Centigrade, and pressure is at or near atmospheric.

EXPERIMENTAL

Example 1

Silicide-Induced Gap Formation Between a Silicon Substrate and a Capping Layer

Figure 2:
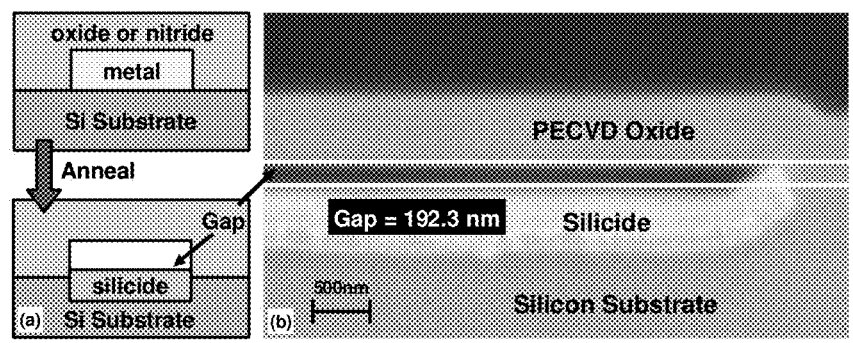
FIG. 2(a) shows a process flow schematic and (b) SEM cross-section of a 192 nm air gap formed between a PECVD deposited oxide and silicide, according to embodiments of the present disclosure. 200 nm Mo reacted with silicon, but not oxide at the anneal temperature.

FIG. 2 shows a process flow schematic used for the formation of a silicide-induced gap between a silicon substrate and a capping layer. In FIG. 2, 200 nm of molybdenum metal was sputtered onto a silicon substrate. The deposited molybdenum metal was patterned by wet etching into strips. 600 nm of plasma enhanced chemical vapor deposition (PECVD) capping oxide ($SiO_2$) was deposited at 300° C. over the molybdenum metal and silicon substrate using reaction gases of $N_2O$ and $SiH_4$. After one minute of annealing at 750° C., a gap formed due to a reduction in volume during silicidation that pulled the silicide surface away from the capping oxide. The rounding at the gap edges resulted from rounding of the original molybdenum metal corners during isotropic wet etching. The gaps took on the shape of the metal layer, and the shape of the silicide was approximately a mirror image of the metal relative to the silicon surface.

Figure 3:
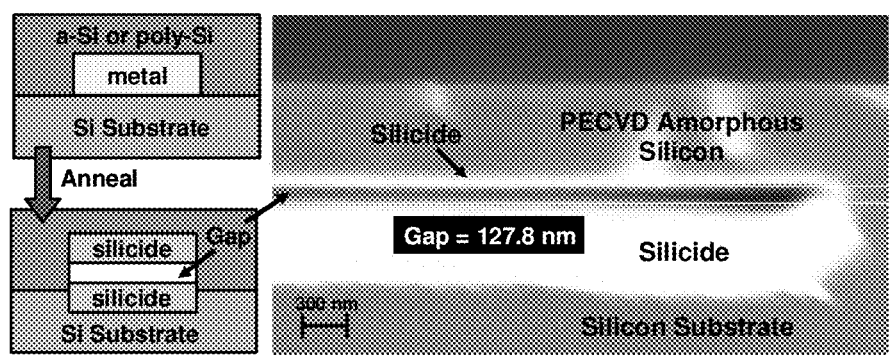
FIG. 3 shows a process flow schematic and SEM cross-section of a 128 nm air gap formed between amorphous silicon and silicide, according to embodiments of the present disclosure. 150 nm Mo reacted with silicon and formed silicides unevenly on both sides due to differences in single-crystal and amorphous Si silicidation behavior.

Silicide-Induced Gap Formation Between a Silicon Substrate and an Amorphous or Poly-Crystalline Silicon Layer The process of FIG. 3 was the same as in FIG. 2, except the process of FIG. 3 differed from that of FIG. 2 in the use of a semiconductor top layer. To form the semiconductor top layer, amorphous silicon was deposited on the molybdenum metal and silicon substrate via plasma-enhanced chemical vapor deposition (PECVD). The silicidation procedure was the same as in FIG. 2, except that silicides formed on both the top and bottom surfaces of the gap. This process, which uses a conductive semiconductor structural material, facilitates the formation of electrostatic transducers. For applications where silicidation at the bottom surface of the second layer (e.g., conductive structural material) is not desired, e.g., due to stress imbalance issues, silicidation can be prevented by depositing a thin layer of dielectric between the second layer (e.g., conductive structural material) and the intermediate layer (e.g., molybdenum metal). The dielectric used may include, but is not limited to, $SiO_2$, $Si_xN_y$, $TiO_2$, and the like. For applications where sub-10 nm dielectric layers are not desired, such as in capacitively transduced high-Q resonators and switches, conductive structural materials that do not react with metal at the silicidation temperatures can be used as structural layers. For example, the conductive structural material can include silicon carbide, polycrystalline diamond, or metals with higher silicidation temperatures.

Formation of a Roughened Silicide Surface

Figure 4:
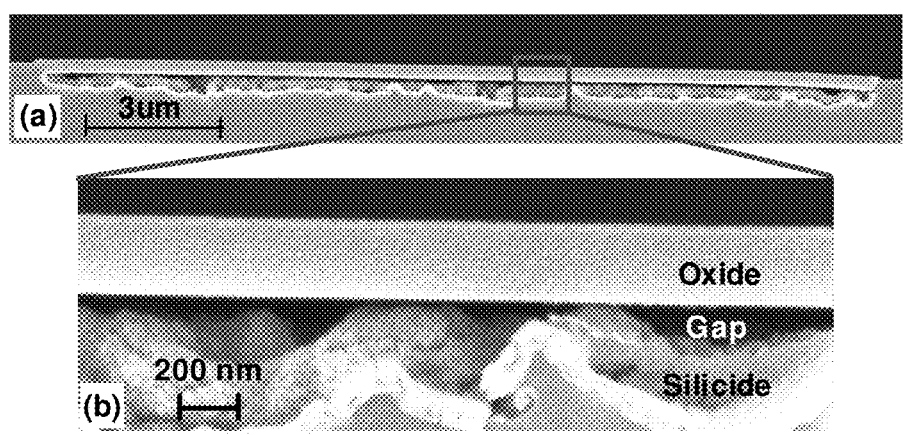
FIG. 4(a) shows a SEM cross-section showing a roughened silicide surface caused by thin oxide at the silicon-metal interface, according to embodiments of the present disclosure.
FIG. 4(b) shows an enlargement of a portion of FIG. 4(a).
Figure 5:
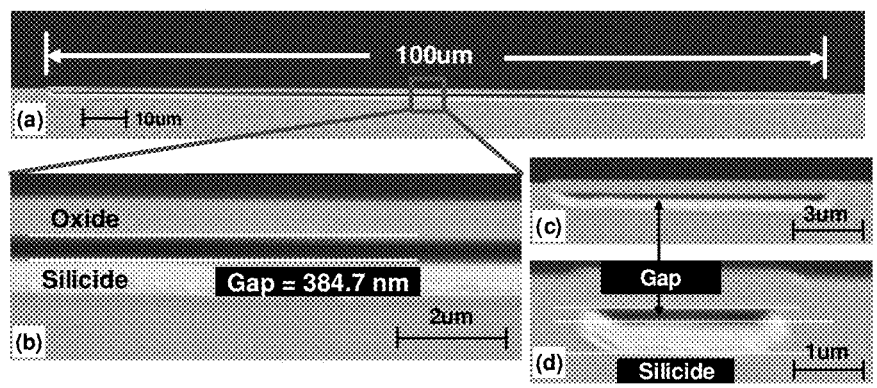
FIG. 5 shows SEM cross-sections of (a) a 100 µm-wide, 410 nm-thick oxide diaphragm suspended 385 nm above a substrate; and (b) an enlargement of a portion of FIG. 5(a), according to embodiments of the present disclosure. The starting Mo thickness was 400 nm.

FIG. 4 shows a SEM cross-section showing a roughened silicide surface caused by thin oxide at the silicon-metal interface. Before metal deposition, substrates were dipped in a piranha bath instead of BHF and no sputter etch was performed. Molybdenum metal was deposited on a silicon substrate, and the same thermal annealing conditions as used in FIGS. 2 and 3 were applied. Silicidation either did not occur or the silicide surface was not uniform and was rough as compared to a silicide surface where the substrate layer was first treated with BHF and sputter etch prior to deposition of the metal layer. If rough surfaces are desired, the above described cleaning step (e.g., treatment of the substrate layer with BHF and sputter etch prior to deposition of the metal layer) need not be performed.

Temperature Stability Experiment

Experiments were performed to determine the stability of the silicide layer to temperature during process steps before and after the silicidation annealing step. Samples of Mo deposited on Si substrates were heated in a conventional oven at 350° C. for 6 hours before and after a one minute 750° C. silicidation annealing step. Substantially no change in the height of the silicide-induced gap was observed versus a Mo-over-Si sample without extra thermal treatments. The height of the silicide-induced gap did not substantially change once the silicide was formed, indicating that thermal processes below the silicidation temperature did not substantially change the size of the gap. Thus, multilayer structures can be released from the underlying substrate at the end of a process as long as processing temperatures after metal deposition do not exceed the silicidation temperature.

Multilayer Structures

Suspended movable structures with various geometries were formed by patterning the second layer (e.g., capping layer) before the silicidation anneal step, as shown in FIGS. 5-8. FIGS. 5-8 show SEM images of various patterned oxide structures released via the described silicide-induced gap formation method. All of the silicidation anneal steps were performed for two minutes or less, or as indicated in the accompanying descriptions. FIGS. 5(a) and 5(b) show SEM cross-sections of a 100×100 μm² membrane with a 260:1 lateral dimension-to-vertical gap aspect ratio. The membrane structure was formed by annealing a 400 nm thick layer of Mo with a silicon substrate for one minute. The gap formed between the silicide and the overlying oxide membrane was 385 nm. FIGS. 5(c) and 5(d) show SEM cross-sections of membranes with smaller sizes formed by the same one minute thermal anneal step as in FIGS. 5(a) and 5(b).

Figure 6:
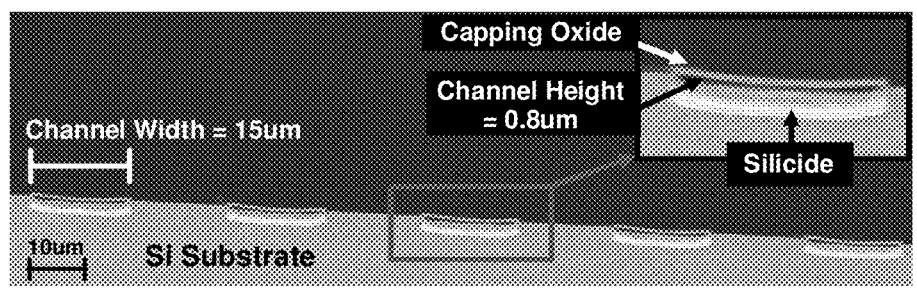
FIG. 6 shows cross-sectional SEM images of an array of oxide-capped microchannels on a silicon substrate fabricated via silicide-induced release, according to embodiments of the present disclosure.

FIG. 6 shows SEM images of an array of 15 μm-wide, 0.8 μm-high, 9 mm-long microchannels formed by the silicide-induced gap formation method as disclosed herein. FIG. 6 demonstrates the repeatability of the method to form a plurality of microchannels with substantially the same dimensions.

Figure 7:
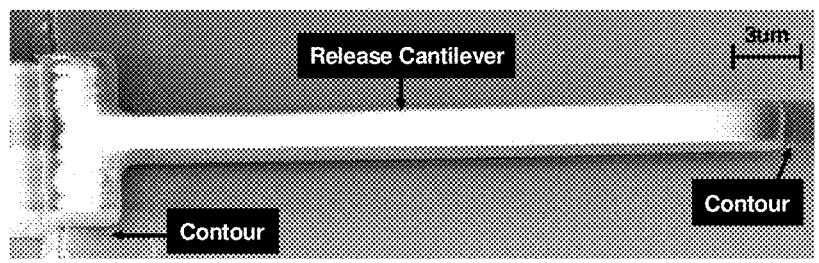
FIG. 7 shows a SEM image of a 1.2 µm-thick oxide cantilever separated from the substrate by a silicide-induced gap, according to embodiments of the present disclosure.
Figure 8:
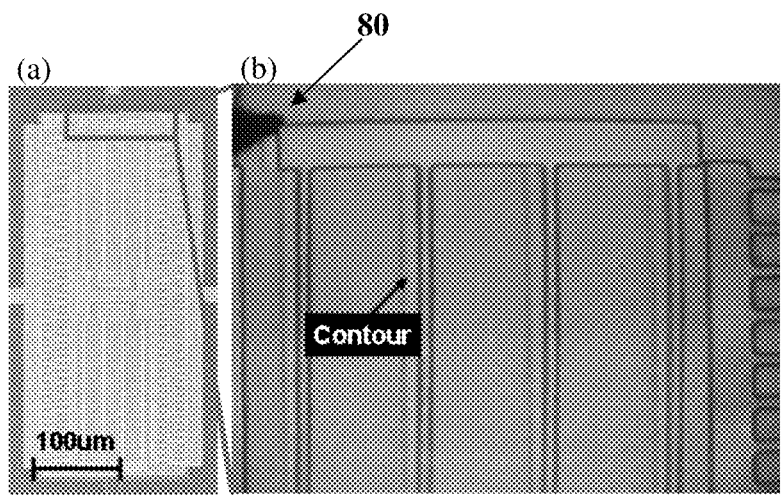
FIGS. 8(a) and 8(b) show SEM images of a released folded-beam comb-driven structure with springs bent by a probe tip, according to embodiments of the present disclosure.

FIG. 7 shows a SEM image of a 20 μm-long, 2 μm-wide, 1.2 μm-thick oxide cantilever suspended over a substrate. The oxide cantilever was formed by patterning the oxide layer prior to the high temperature silicidation anneal step.

FIG. 8(a) shows a SEM image of a folded-beam comb-driven resonator. The resonator was released from the underlying substrate by a high temperature silicidation anneal step according to the methods disclosed herein. The release of the resonator from the underlying substrate was confirmed by bending the resonator with a probe 80 (see FIG. 8(b)). Displacement of the resonator from its un-bent contour line was observed (see FIG. 8(b)).

Using the methods and systems disclosed herein, two or more gaps may be formed between various layers of a multilayer structure. FIGS. 9(b-1) and 9(b-2) show a process flow schematic where gaps are formed between the capping layer and structure layer and between the structure layer and underlying silicon substrate. In this example, the bottom silicon substrate is first layered with a first metal, and then a structural material is deposited over the first metal. The structural material may be silicon or may include silicon compounds that react with the metals in the annealing step. Over the structural material is deposited a second metal layer, followed by deposition of a capping layer. During the annealing step gaps may be formed between the capping layer and structure layer and between the structure layer and underlying silicon substrate.

Sub-50 nm Gaps

Figure 10:
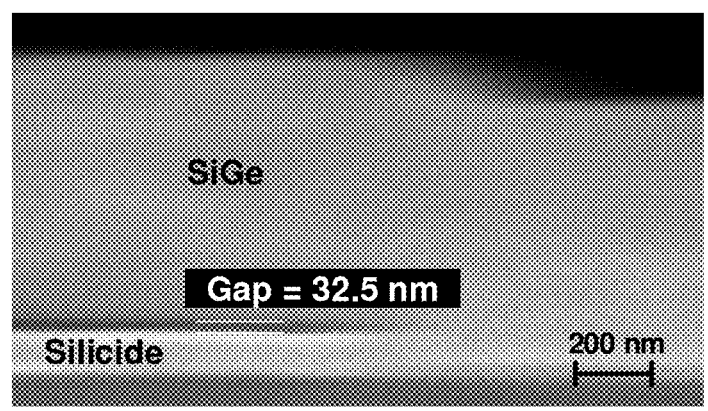
FIG. 10 shows a SEM cross-section of a 32.5 nm gap formed between a bottom $MoSi_2$ silicide and a top SiGe capping layer, according to embodiments of the present disclosure.

Experiments were performed to produce gaps of 50 nm or less using the silicidation methods as disclosed herein. Production of sub-50 nm gaps facilitates formation of vibrating RF micromechanical resonators using capacitive transduction. FIG. 10 shows a SEM cross-section image of a 32.5 nm gap underneath a SiGe capping layer. The silicide-induced gap was formed using a thirty second silicidation reaction between Mo metal and the underlying silicon substrate. Substantially no reaction occurred with the capping SiGe layer. As demonstrated by this experiment, release times for silicide-based release do not substantially increase as the aspect ratio increases because uniform silicide-induced gap formation was achieved in thirty seconds in this experiment. Smaller gaps than shown in FIG. 10 may be formed via the use of a thinner metal layer. The smallest achievable gap may depend on the surface roughness of the silicide. In some cases, the surface roughness of the silicide is 10 nm or less for metals such as nickel, titanium, and cobalt. Formation of sub-50 nm gaps facilitates the formation of capacitively transduced resonators having an impedance of 50Ω or less.

Silicide-Induced Gap Formation on Amorphous Silicon Substrate

Figure 11:
FIG. 11 shows a SEM cross-section image of a silicide-induced gap formed over a 1.2 µm PECVD amorphous silicon film deposited at 300° C., according to embodiments of the present disclosure.

Experiments were performed to form a silicide-induced gap on an amorphous silicon substrate. FIG. 11 shows a SEM cross-section image of a gap formed between a top oxide capping layer and a 1.2 μm PECVD amorphous-silicon layer deposited at 300° C. As shown in FIG. 11, the silicide-based release process can be applied to MEMS/NEMS built atop CMOS or on substrates other than silicon, such as glass, as long as a thin layer of semiconductor is available. Using similar methods, such as PECVD and/or atomic layer deposition (ALD) to deposit conformal lateral semiconductor and metal films, the silicidation methods may be used to form lateral gaps.

Beam Resonators

Figure 12:
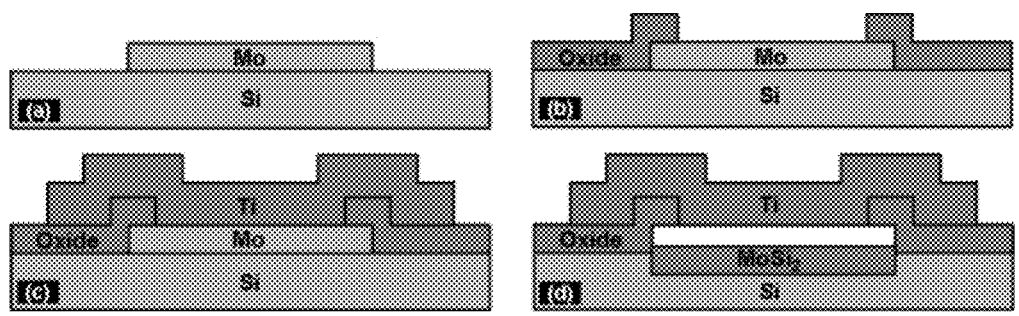
FIG. 12 shows a process flow schematic for producing a titanium clamped-clamped beam released via silicidation, according to embodiments of the present disclosure.

A three-mask process for forming titanium clamped-clamped beam resonators is shown in FIG. 12. The clamped-clamped beam resonator used titanium (Ti) as a structural material and Mo as the intermediate metal layer to form the beam resonators. In this process, Mo was sputter deposited on a silicon substrate after an in-situ sputter etch to remove native oxide from the surface of the silicon substrate (FIG. 12(*a*)). The deposited Mo was then patterned using a commercial aluminum wet etchant (pre-mixed phosphoric and acetic acid mixture) at 50° C. Next, 300 nm of 300° C. PECVD oxide isolation layer was deposited, and the PECVD oxide layer was patterned via a BHF dip (FIG. 12(*b*)). 700 nm of Ti structural material was sputter deposited on the Mo metal layer and PECVD oxide layer at 300° C. (FIG. 12(*c*)). The Ti was then dry etched via a Cl$_2$/BCl$_3$ plasma, with the etch stopping on the underlying Mo or oxide layer. The Ti structure was released via a one minute rapid thermal anneal step at 750° C. As shown in FIG. 12, MoSi$_2$ formed the ground plane/drive electrode for this clamped-clamped beam, and the oxide layer prevented the Ti beam from shorting with the silicide.

Figure 13:
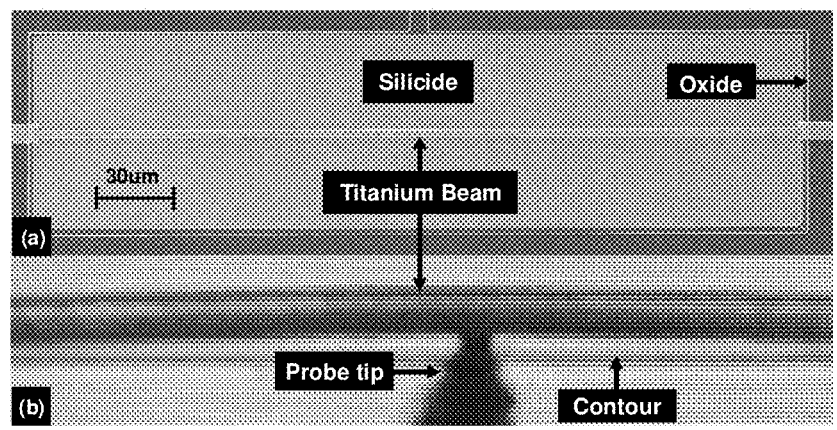
FIG. 13(a) shows a SEM image of a 320 µm-long, 3 µm-wide, 700 nm-thick titanium clamped-clamped beam using the process of FIG. 12, according to embodiments of the present disclosure.
FIG. 13(b) shows a SEM image of bending via a probe tip to confirm release of the clamped-clamped beam structure.
Figure 14:
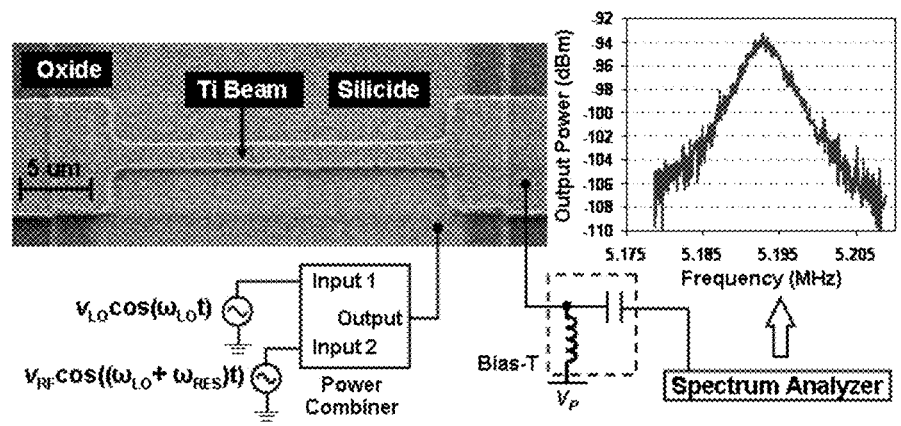
FIG. 14 shows schematics of a mixing measurement setup and a graph of the measured resonant peak under vacuum for a Ti clamped-clamped beam released via silicidation, with Q=1,082, according to embodiments of the present disclosure. $P_{RF}$=10 dBm (network analyzer output), $V_{LO}$=10 VP-P, and $V_P$=20 V.

FIG. 13 shows SEM images of a released 320 μm-long, 3 μm-wide, 700 nm-thick Ti clamped-clamped beam displaced laterally by a probe tip. The clamped-clamped beam was formed using the process flow described in FIG. 12. FIG. 14 shows the mixing-measured frequency characteristic (in vacuum) for a 20 μm-long, 2 μm-wide beam with 150 nm electrode-to-resonator vertical gap spacing, which confirmed that the beam was released from the underlying substrate by the silicide-based release process and that the released beam was functional.

Silicide-Induced Lateral Gap Formation

Figure 15:
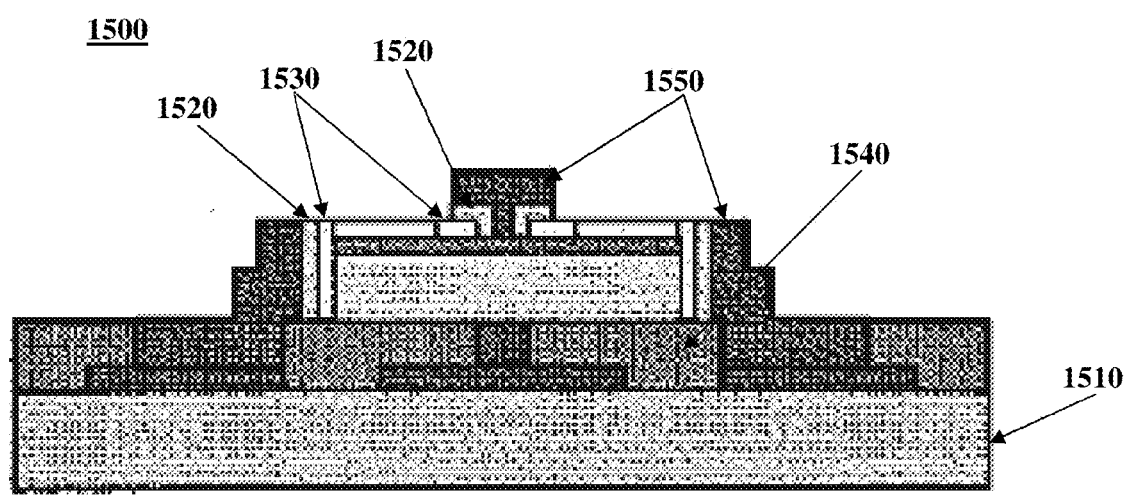
FIG. 15 shows a schematic cross-section of a multilayer structure configured to form lateral gaps, according to embodiments of the present disclosure.

FIG. 15 shows a schematic cross-section of a multilayer structure 1500 configured to form lateral gaps. The multilayer structure 1500 is formed on a bottom substrate 1510. The multilayer structure 1500 includes structural layers 1550 and oxide layers 1540. In addition, the multilayer structure 1500 includes vertical silicon layers 1520. Adjacent the vertical silicon layers 1520 are deposited vertical metal layers 1530. The vertical silicon layers 1520 and the vertical metal layers 1530 are configured such that the high temperature annealing process forms lateral gaps upon silicide formation.

Example 2

Capacitive Piezoelectric Transducer

Figure 19:
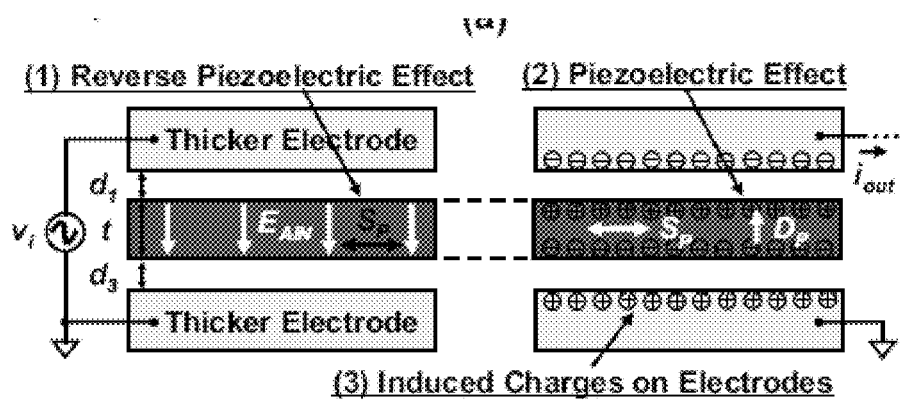
FIG. 19 shows a schematic showing working principals behind a capacitive piezoelectric resonator in which electrodes are separated from the piezoelectric body via tiny gaps, according to embodiments of the present disclosure.
Figure 20:
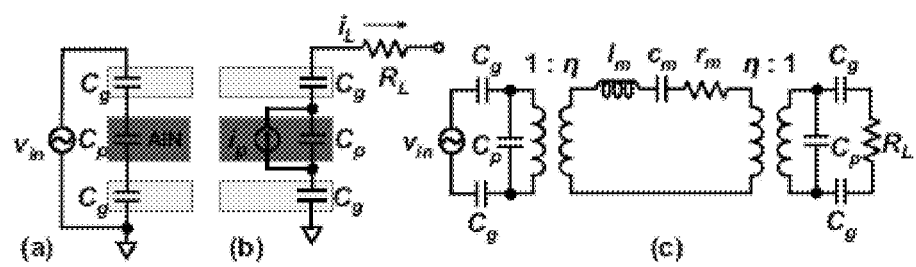
FIG. 20 shows an equivalent electrical circuit at (a) input and (b) output, modeling the effect of gap spacing on the electromechanical coupling coefficient; (c) equivalent circuit of a capacitive piezoelectric resonator, according to embodiments of the present disclosure. $\eta$ is the coupling coefficient with gap spacing $d_{Total}=0$.
Figure 21:
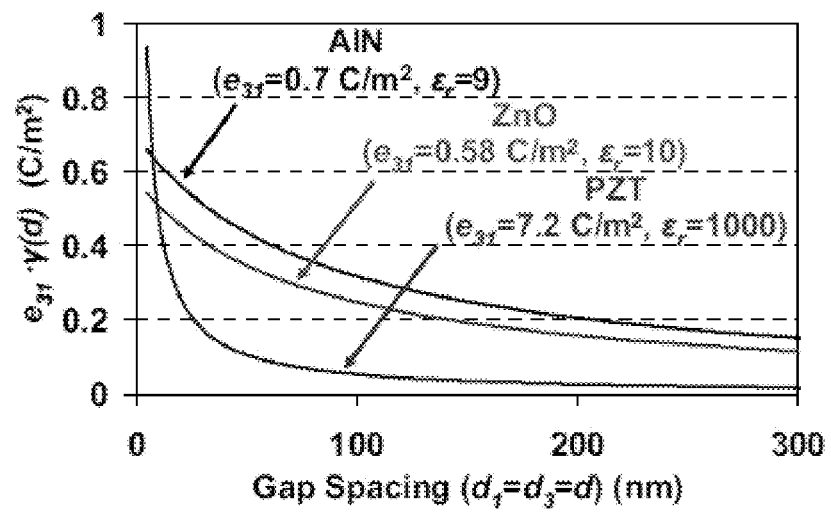
FIG. 21 shows a graph of the $(e_{31} \cdot \gamma(d_{Total}))$ product for different piezoelectric materials, according to embodiments of the present disclosure.

FIG. 19 shows a cross-section of a contour-mode resonator with capacitive piezoelectric transducers under a typical excitation configuration. When the input signal is applied across the top and bottom electrodes, mechanical strain, S$_P$, is induced on the AlN film via the reverse piezoelectric effect. The induced strain is linearly proportional to both the piezoelectric stress constant, e$_{31}$ (e$_{31}$~0.7 C/m$^2$ for sputtered AlN), and the electric field established within the AlN film, E$_{AlN}$, regardless of the mode shape of the resonator. The gap-AlN-gap stack can be modeled by three capacitors in series, as shown in FIG. 20(*a*), from which E$_{AlN}$ can be written as $$E_{AlN} = \frac{v_{in}}{t + \varepsilon_r d_{Total}}$$

where $\varepsilon_r$ (~9) and t are the relative permittivity in the c-axis direction and thickness of AlN, respectively; and d$_{Total}$ is the total gap spacing (d$_{Total}$=d$_1$+d$_3$). When the input frequency matches the resonance frequency, the lateral force F$_P$ induced by E$_{AlN}$ via the reverse piezoelectric effect excites the resonator into lateral-mode vibration with an electromechanical coupling coefficient on the drive side given by $$\eta_{Drive} = \frac{F_P}{v_{in}}$$
$$= \alpha \cdot e_{31} \cdot \frac{t}{t + \varepsilon_r d_{Total}}$$
$$= \alpha \cdot e_{31} \cdot \gamma(d_{Total})$$

where the value of α depends on the electrode coverage area and placement, and on the resonator mode shape; and where γ(d$_{Total}$) is a function gauging how much the coupling coefficient degrades with increasing air gap spacing. FIG. 21 plots the (e$_{31}$·γ(d$_{Total}$)) product for different piezoelectric materials. The effective e$_{31}$ on the drive side decreases as the gap spacing increases. The gap spacing affects the coupling of PZT the most due to its much larger relative permittivity $\varepsilon_r$. In general, small gap spacing is preferred to maintain a high coupling coefficient. As shown in FIG. 21, even though PZT has a larger e$_{31}$ than AlN and ZnO, its capacitive-piezo coupling is weaker at most gap spacings due to its much higher relative permittivity. On the sense side, vibration-induced strain polarizes the AlN film via the piezoelectric effect, and the resulting electric displacement can be expressed as $$D_P = e_{31} S_P$$
$$= e_{31} \left[ \frac{\partial u_x}{\partial x} + \frac{\partial u_y}{\partial y} \right]$$

where u$_x$ and u$_y$ are the mechanical displacements in the x and y directions, respectively. Assuming a perfectly aligned AlN film and no spurious modes, AlN is uniformly polarized (i.e., with only bound surface charges and no bound body charges), D$_P$ is purely along the vertical direction, and the integral of D$_P$ over the entire electrode area equates to the total amount of induced charge Q$_P$, the time derivative of which becomes the current i$_P$. The piezoelectric effect on the sense side can thus be modeled by a current source with magnitude i$_P$=ω·Q$_P$ as shown in FIG. 20(*b*), and the output current, i.e., the current flowing though R$_L$ (R$_L$=50Ω for measurement with a network analyzer); becomes $$i_{Out} = i_P \cdot \frac{Z_P}{Z_P + Z_g + Z_g + R_L} \approx i_P \cdot \frac{t}{t + \varepsilon_r d_{Total}}$$
$$= i_P \cdot \gamma$$

From the above equation, the electromechanical coupling coefficient on the sense side, η$_{Sense}$, is also a function of the gap spacing through $\gamma(d_{Total})$. Although air gaps degrade $k_t^2$ by a factor of $\gamma^2$, the higher Q provided by non-contacting electrodes together with sufficiently small gap spacings facilitate higher $Q \cdot k_t^2$ than piezoelectric resonators with contacting electrodes.

Different transducers may be compared via the filter FOM defined in the above equation, given by $$FOM = \frac{1}{R_Q C_o} \propto \frac{\eta_{Drive}\eta_{Sense}}{m_r C_o}$$

where $R_Q$ is the filter termination resistor, $C_o$ the physical input capacitance, and $m_r$ the motional mass of a constituent resonator in the filter. The right most form delineates parameters in the expanded equation most relevant to resonator design.

Figure 22:
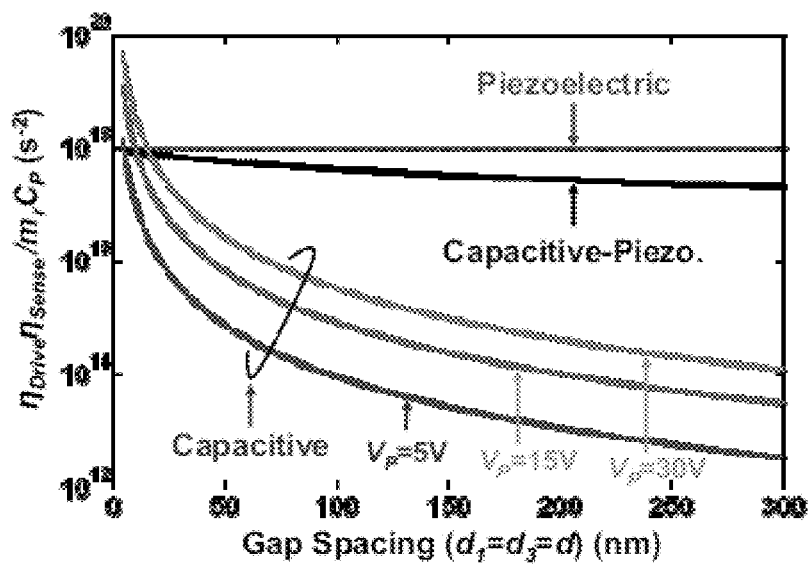
FIG. 22 shows a graph of a comparison of filter FOM of different transducers as a function of gap spacing, given the same filter bandwidth and type, according to embodiments of the present disclosure.

FIG. 22 compares simulated plots of $(\eta_{Drive}\eta_{Sense}/m_r C_o)$ in the filter FOM for three different transducers (i.e., piezoelectric, capacitive-piezo, and capacitive alone) versus gap spacing d ($d=d_1=d_3$) at the same frequency. The simulation used a ring inner radius and thickness of 25.6 µm and 1.5 µm, respectively; and ring widths of 5 µm for AlN and 4.3 µm for polysilicon, both chosen to achieve a 1.2-GHz resonance frequency for both materials under the same mode shape, neglecting DC bias-induced electrical spring softening inherent to capacitive resonators. In addition, the electrodes for the polysilicon resonator were assumed to be placed both inside and outside the ring. The FOM of the capacitive-piezo transducer depended on gap spacing. $C_o$ dropped by the same ratio γ as the electromechanical coupling coefficient when the gap spacing increased. A capacitive-piezo transducer with a 200 nm gap spacing achieved $(\eta_{Drive}\eta_{Sense}/m_r C_o)$ of $2.7\times10^{17}$ s$^{-2}$, for which a capacitive (alone) transducer would require a much smaller gap spacing of 23 nm.

Fabrication of Capacitive Piezoelectric Transducer

Figure 23:
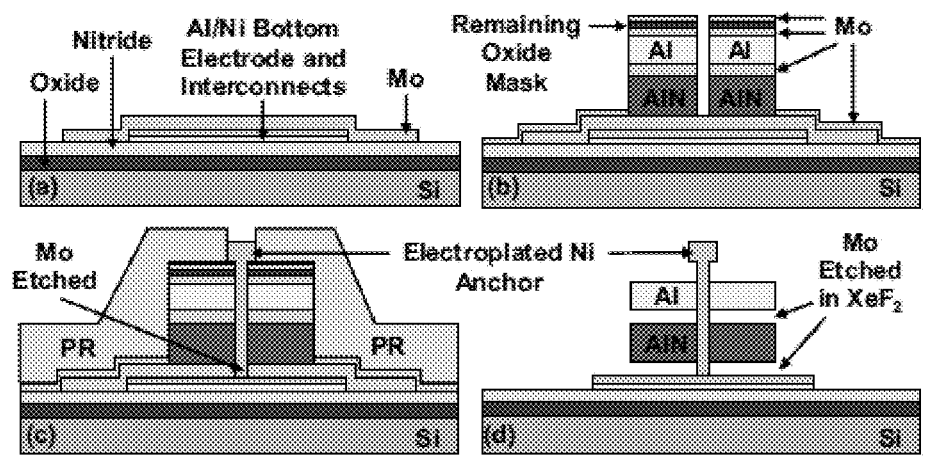
FIG. 23(a)-(d) shows a schematic of a fabrication process flow of capacitive piezoelectric AlN resonator with electroplated Ni anchor and Mo sacrificial material dry released in $XeF_2$, according to embodiments of the present disclosure.

AlN resonators employing capacitive-piezo transducers were fabricated using a 4-mask low-temperature CMOS-compatible process summarized in FIG. 23. Here, aluminum top and Al/Ni bottom electrodes were temporarily separated from the AlN structure by a sputtered molybdenum (Mo) sacrificial material. Molybdenum was used as a sacrificial material instead of the oxide, silicon, or germanium, more commonly used in surface-micromachining processes, mainly to attain better c-axis orientation when sputtering the AlN film. Anchoring for all suspended structures, including the AlN and top electrode, was performed by a single electroplated nickel peg that contacted the top electrode. The device was released via a gaseous XeF$_2$/N$_2$ etchant.

Figure 24:
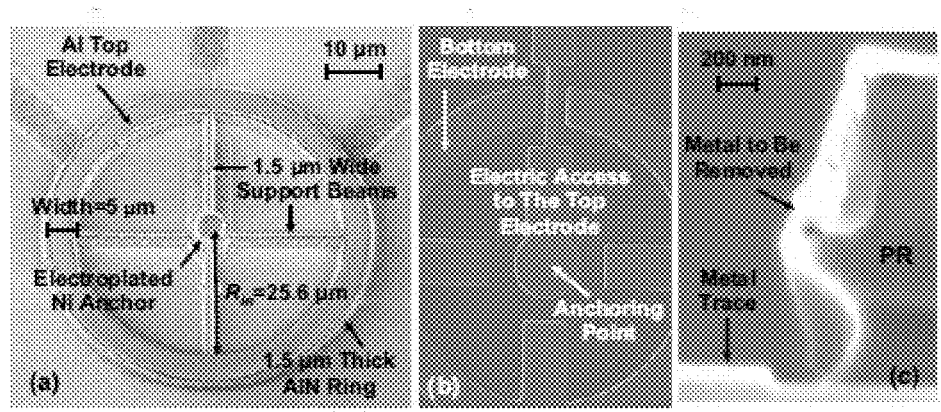
FIG. 24 shows SEM images of (a) Fabricated 1.2-GHz capacitive-piezo AlN ring resonator; (b) bottom electrode and interconnect configuration, showing anchoring at the very center; and (c) cross sectional SEM showing the double-layer lift-off process that ensures smooth metal trace edges, according to embodiments of the present disclosure.
Figure 25:
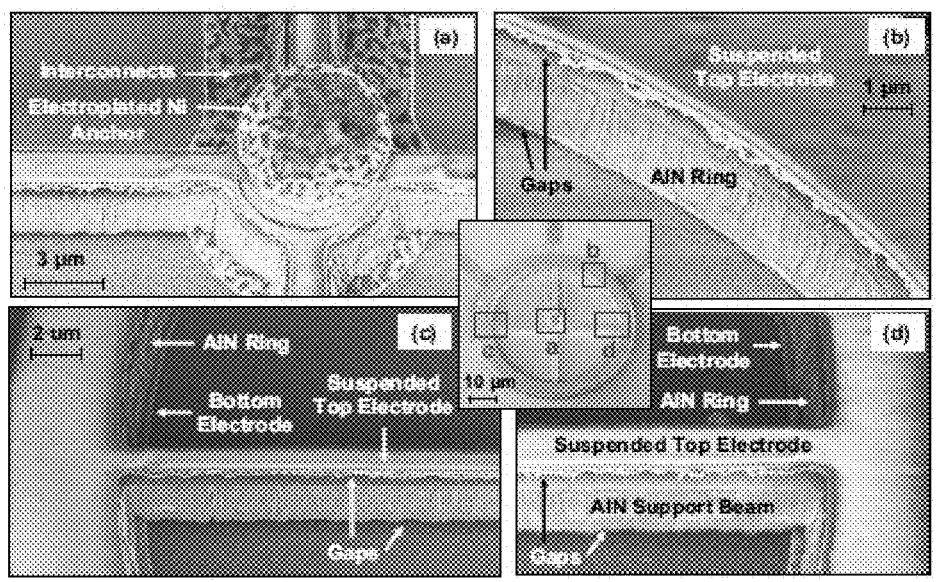
FIG. 25(a)-(d) shows SEM images at different parts of the same resonator confirming that the entire top electrode and the AlN ring resonator were suspended via the electroplated nickel anchor at the center, according to embodiments of the present disclosure.

FIG. 24(a) presents the wide-view SEM of a completed 1.2-GHz contour-mode d$_{31}$-capacitive-piezo-transduced ring resonator. FIG. 25 presents SEM's of different parts of the same ring resonator delineating the gaps between the top/bottom electrode and the resonator. For this device, to reduce electrode resistance, 400 nm thick Al was used as the top electrode.

Measurements

Figure 26:
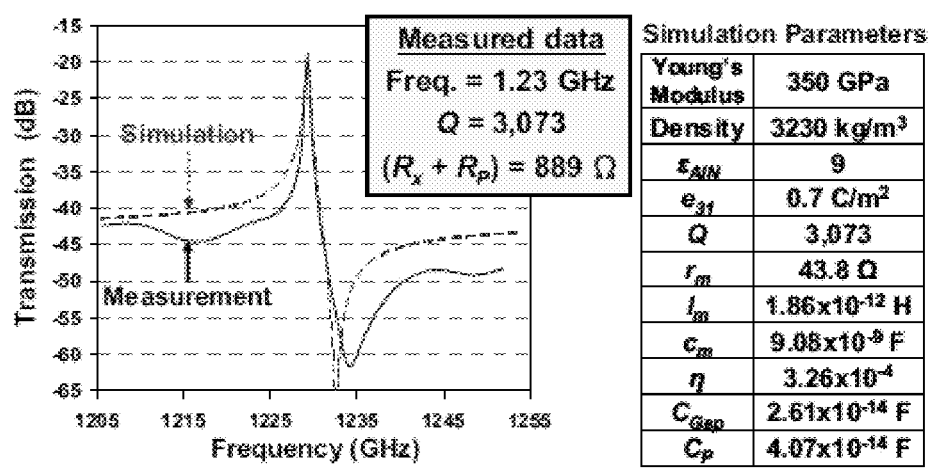
FIG. 26 shows a graph of measured frequency characteristics for a 1.2-GHz AlN ring capacitive piezoelectric resonator with dimensions as shown in FIG. 24 and equivalent circuit as shown in FIG. 20(c).
Figure 27:
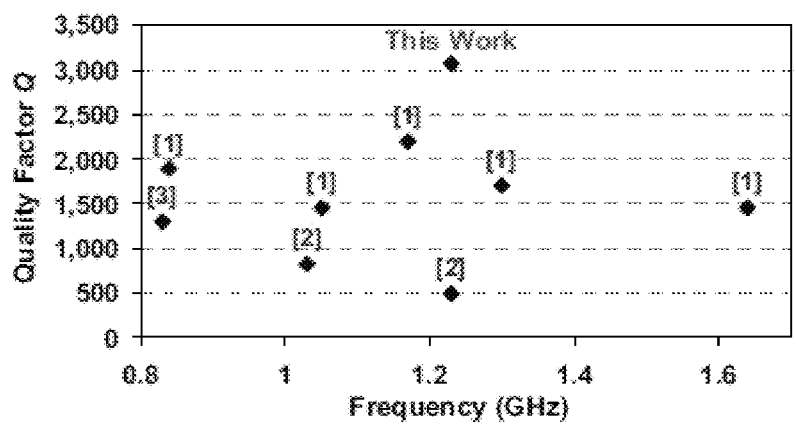
FIG. 27 shows a graph of quality factor (Q) vs. frequency (GHz) which shows a comparison of Q's for the capacitive piezoelectric ring resonator according to embodiments of the present disclosure versus other ~1 GHz lateral-mode resonators.

FIG. 26 presents the measured frequency response characteristics for the AlN ring resonator of FIG. 24(a), showing $f_s$=1.23 GHz, Q=3,073, and $R_x$=889Ω at 3 mTorr. Both the input and output were DC grounded via bias-tee's to avoid electrostatic forces that might pull the top and bottom electrodes together and into the AlN resonator. The measured Q was substantially higher than any other measured contour-mode AlN resonator at similar frequencies, as plotted in FIG. 27. The capacitive piezoelectric resonator had 260 nm gap spacing. In some embodiments, the gap spacing may be less than 260 nm, such as 100 nm. In certain instances, the impedance may be lowered to 250Ω.

Figure 28:
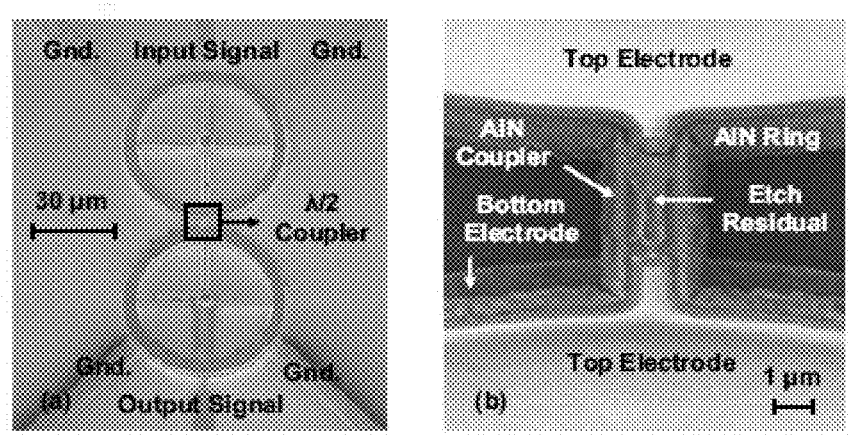
FIG. 28 shows (a) SEM of a capacitive-piezo ring resonator array with $\lambda/2$ coupler; and (b) top-view SEMS showing how the electrode is removed from the coupler to electrically isolate the output from the input, according to embodiments of the present disclosure.
Figure 29:
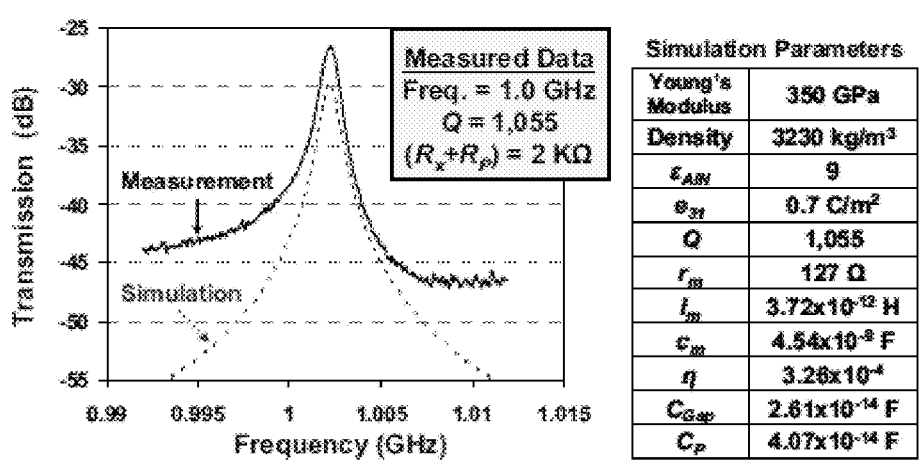
FIG. 29 shows a graph of the measured frequency characteristic for the resonator of FIG. 28 confirming suppression of the parallel resonance peak, according to embodiments of the present disclosure.

To evaluate the efficacy of building mechanical circuits using capacitive-piezo transducers, mechanically coupled two-resonator arrays, shown in FIG. 28, were also fabricated and tested. The top electrode on the coupling beam was removed to electrically isolate the output from the input. The measured frequency response, shown in FIG. 29, exhibited much less feedthrough than seen in single-electrode devices.

Conclusions

A 1.2-GHz contour-mode AlN ring resonator with a motional resistance of 889Ω and Q=3,073 was produced, confirming that resonators equipped with capacitive piezoelectric transducers can achieve higher Q than so far measured for any other d$_{31}$-transduced piezoelectric resonator at this frequency and at the same time maintain high electromechanical coupling.

Example 3

Capacitive Piezoelectric Transducer

FIG. 19 shows a cross-section describing the basic structure and concept behind the capacitive-piezo transducer. Instead of attaching the electrodes directly to the resonant piezoelectric structure, the electrodes were separated from the structure, but in very close proximity. Typical electrode-to-resonator gaps were 100 nm in order to maintain strong electric fields through the piezoelectric material sandwiched between the top and bottom electrodes. If the gap spacing was small, electromechanical coupling was reduced only a small amount, while Q was greater than 12,000.

Generally, electrodes in contact with the piezoelectric material may dissipate energy in numerous ways, such as direct strain coupling of the resonator to its lossy metal electrodes, interface thermoelastic dissipation (TED), and hysteretic movement of electrode-to-resonator interface defects. Separating the electrodes from the piezoelectric resonator not only eliminated the above loss mechanisms, but in so doing also obviated constraints on electrode thickness previously used to lessen electrode-based mechanical losses. This then permitted the use of thicker electrodes, which in turn reduced electrode resistance, further increasing the Q of the total device.

Tapping the Material Q of AlN

Figure 30:
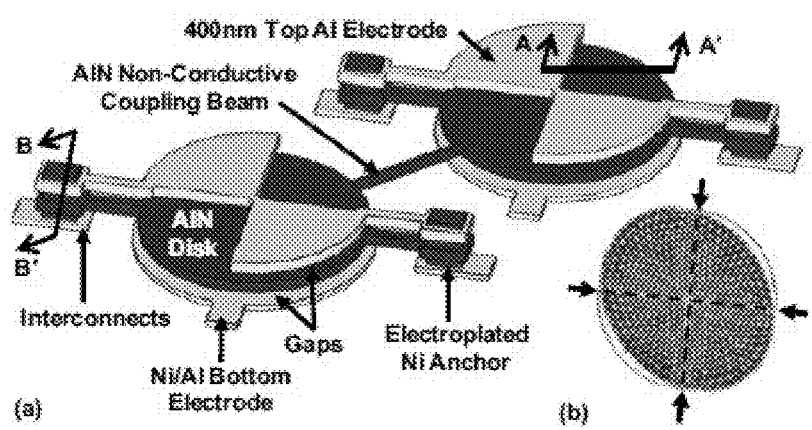
FIG. 30 shows a schematic of (a) an array-composite of two AlN disks employing capacitive-piezo transducers with non-contacting electrodes, drawn with exaggerated vertical gaps, according to embodiments of the present disclosure. The top electrodes were patterned for wine-glass mode resonance, for which quasi-nodal points may be accessed on the edges, as shown in FIG. 30(b).

The capacitive piezoelectric transducer used the disk geometry shown in FIG. 30(a) that vibrated in the wineglass mode shape shown in FIG. 30(b), in which the disk expanded and contracted in opposite directions along orthogonal axes. In this mode shape, nodal lines shown in FIG. 30(b) were accessible at points along the disk edge, obviating the need for notches and facilitating a significant increase in the quality factor (Q).

The wine-glass mode shape used here that facilitated an increase in Q also generated longitudinal and shear strains that were out-of-phase. To simplify measurement, half wavelength coupled arrays of disks were used, such as shown in FIG. 30(a). Uniform bottom and patterned top electrodes were spaced 260 nm from the top and underside, respectively, of each AlN disk. The top electrodes were in electrical contact to substrate interconnects through vias at the anchors. Half-wavelength coupling effectively converted this device into a single composite device where constituent resonators vibrated together at one mode frequency, with little or no reduction in the overall Q of this mechanical circuit relative to that of a stand-alone device. The use of two devices in this mechanical circuit made available two ports for interrogation: an input port to drive the device, and an output port to sense its motion, both separated by a nonconductive AlN coupling beam that blocked feedthrough current, thereby facilitating evaluation of piezoelectric wine-glass disks.

Device Fabrication

Figure 31:
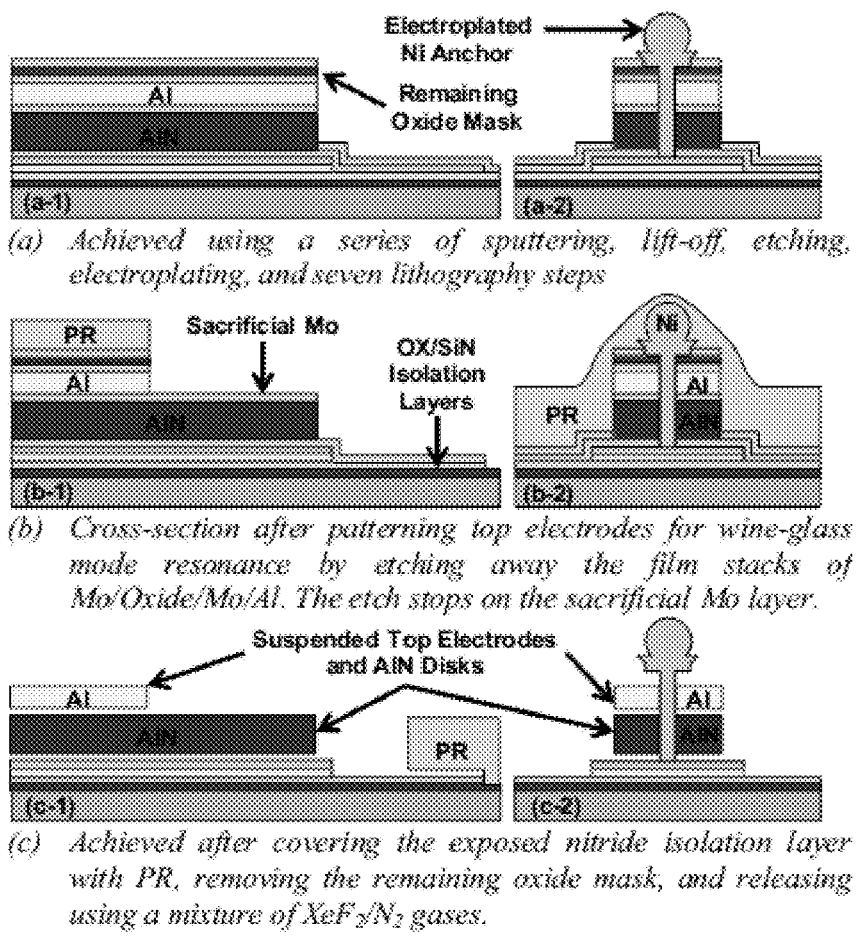
FIG. 31(a)-(c) shows cross-sections along A-A' and B-B' in FIG. 30(a) summarizing the last few steps of the fabrication process flow for a capacitive piezoelectric transducer, according to embodiments of the present disclosure.

FIG. 31 shows cross-sectional views of a capacitive piezoelectric wine-glass disk resonator at different steps during its fabrication. The process for these devices was similar to that described above for a device of Example 2 up to the step of electroplating nickel anchors, at which point the cross-section is as shown in FIG. 31(a). The next step in the process included patterning the top electrodes on the AlN disks, etching them and stopping on the molybdenum layer between AlN and Al top electrodes, shown in FIG. 31(b). This step included that Mo and Al were dry etched one after the other, and this was done using $Cl_2$-based chemistries with varying amounts of added $O_2$ that alter etch selectivities. After another lithography step to cover the exposed nitride isolation layer and another dry etch to remove the remaining oxide mask above the remaining Al films, the resonators were baked at 120° C. for 20 minutes to dehydrate the wafers, then released in a mixture of $XeF_2/N_2$ gases, to yield the cross-section of FIG. 31(c). The dehydration bake prevented moisture from forming HF during the $XeF_2$ dry release etch, which effectively enhanced the etch selectivity of molybdenum over oxide and nitride isolation layers. Such high etch selectivity was used to release 50 μm-radius disks suspended 260 nm above the substrate.

Figure 32:
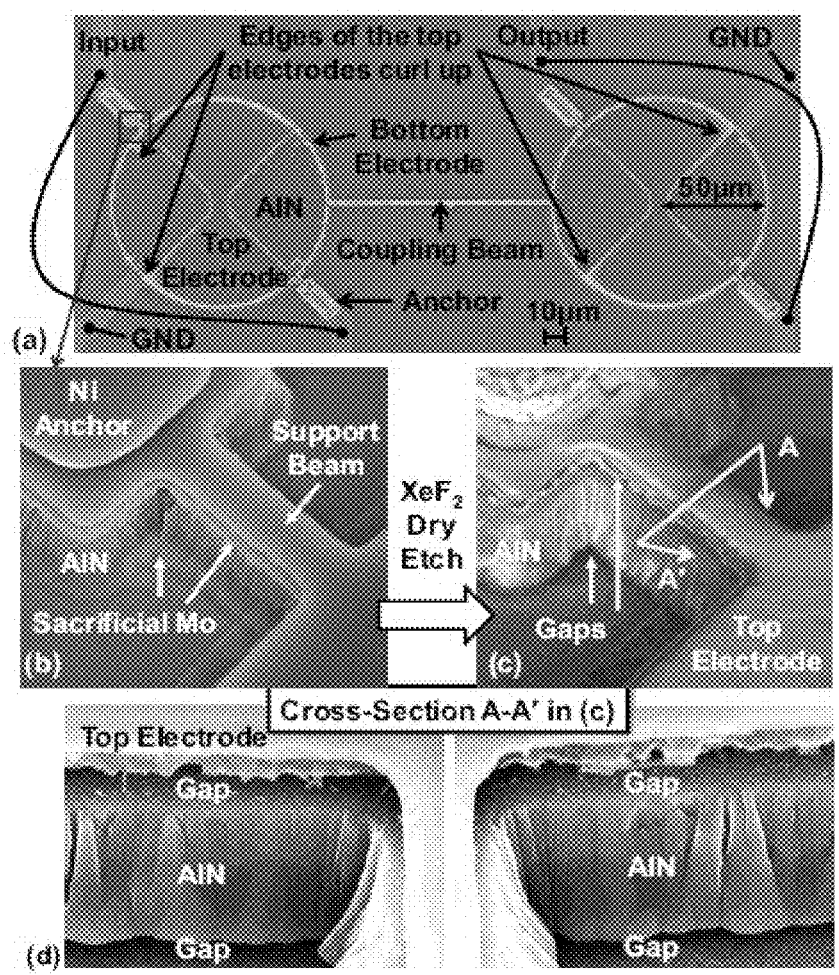
FIG. 32 shows SEMs of (a) a fabricated $AlN^2$-disk array-composite with zoom-ins on an anchor (b) before and (c) after $XeF_2$ dry release, according to embodiments of the present disclosure.

FIG. 32(a) shows the overhead SEM of a fabricated capacitive-piezo two-disk array-composite resonator. FIGS. 32(b) and (c) show zoom-in views on the anchoring areas before and after release, respectively, showing that the Al top electrode and the AlN structural layer were supported by electroplated nickel anchors after removing the sacrificial molybdenum layer. FIG. 32(d) shows zoom-in views of the A-A' cross-section in FIG. 32(c), showing 260 nm gaps both above and under the AlN disk between the electrodes.

Experimental Results

FIG. 32(a) shows the set-up used to measure the frequency characteristics for two-disk array-composites. The bottom electrodes of both resonators were grounded, while an AC input signal was applied to the top electrode of the left device and the output taken from that of the right. Although the input and output electrodes included AC signals, they were DC grounded to prevent large electrostatic forces from pulling the electrodes into contact with the AlN disks.

Figure 33:
FIG. 33 shows SEM images of the support beams used in a capacitive piezoelectric wine glass disk resonator with various widths: (a) 1 µm; (b) 1.5 µm; and (c) 2 µm, according to embodiments of the present disclosure.
Figure 34:
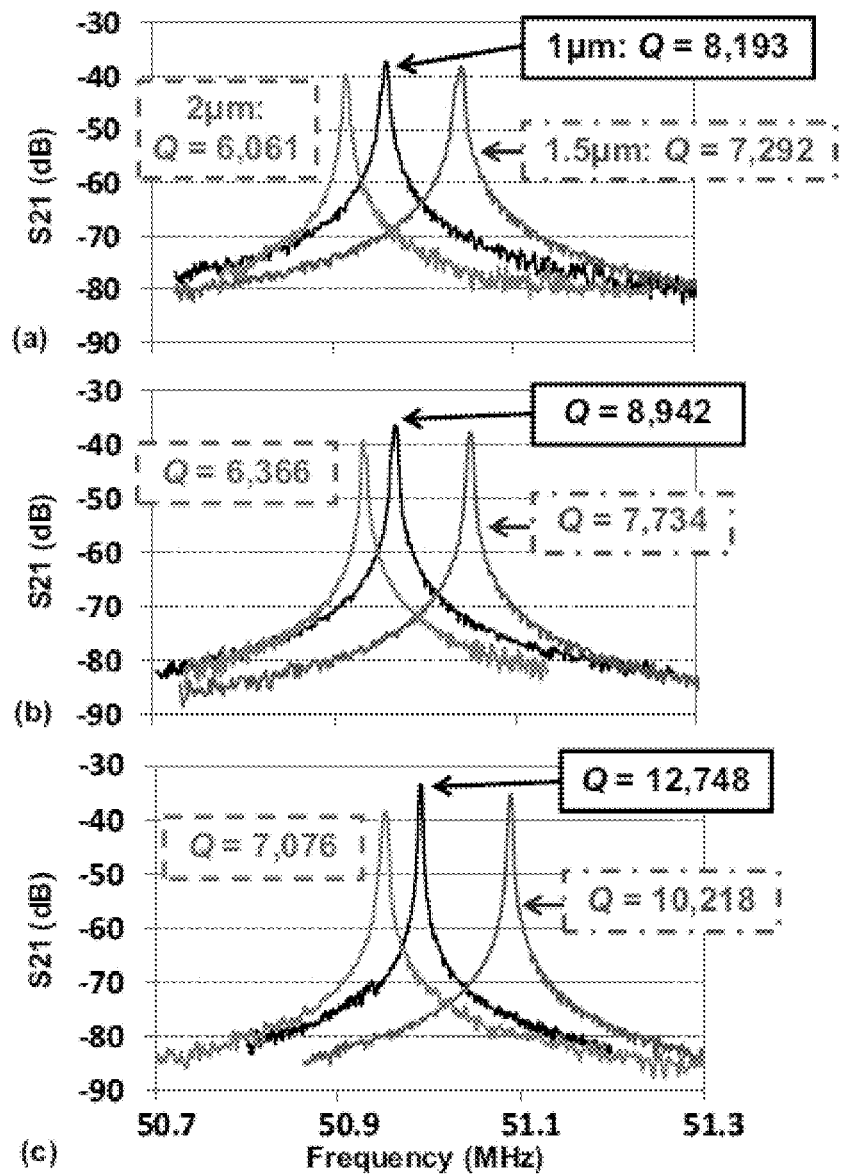
FIG. 34 shows graphs of the measured frequency characteristics for the resonator of FIG. 32 after each cleaning and anneal procedure: (a) as released; (b) after $O_2$ plasma clean, EKC-270 dip, and critical point drying; and (c) after annealing at 300° C. in forming gas for 30 minutes, achieving a Q of 12,748, according to embodiments of the present disclosure.

FIG. 34(a) presents measured frequency characteristics for two-disk array composite resonators employing various support beam widths (c.f., FIG. 33) measured immediately after $XeF_2$ release, with the photoresist protecting nitride/oxide isolation layers during the release still present on the chip. Resonators with support beam widths of 1 μm, 1.5 μm, and 2 μm, exhibited Q's of 8,193, 7,292 and 6,061, respectively. After removing photoresist via $O_2$ plasma etching, then dipping in EKC-270 and performing critical point drying, Q's increased for all three cases, as shown in FIG. 34(b), up to 8,942 for the embodiment with the 1 μm-wide support.

A subsequent anneal in $N_2/H_2$ at 500° C. for 30 minutes further increased Q to 12,748 (for the embodiment with the 1 μm-wide support). The increase in Q may be due to the removal of etch residuals or contaminants, strengthening or stress relaxation in the nickel anchor pegs, or changes in the AlN material, e.g., stress relaxation.

Conclusions

By applying capacitive-piezo transduction to separate a 50-MHz AlN two-disk array-composite resonator from its electrodes by nano-scale gaps, a Q of 12,748 was measured. For example, a capacitive piezoelectric transducer with Q>10,000 may be used in RF channel-select wireless communication front-ends.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A method of producing a gap between a first material and a second material of a structure, the method comprising:
   subjecting a structure comprising a first material and a second material to conditions sufficient to cause a decrease in the volume of at least a portion of at least one of the first material and the second material to produce a gap between the first material and the second material.

2. The method according to claim 1, wherein the subjecting comprises subjecting the structure to electromagnetic radiation.

3. The method according to claim 1, wherein the structure further comprises an intermediate material positioned between the first material and the second material, and wherein the subjecting comprises subjecting the structure to conditions sufficient for at least a portion of the intermediate material and the first material to react to produce a product compound and a gap between the first material and the second material.

4. The method according to claim 3, wherein the first material comprises silicon, the intermediate material comprises a metal and the product compound comprises a silicide.

5. The method according to claim 4, wherein the metal is selected from the group consisting of Ni, Ti, Pt, Co and Mo.

6. The method according to claim 3, wherein the second material is selected from the group consisting of an oxide, silicon and a metal.

7. The method according to claim 3, wherein the conditions comprise subjecting the structure to a temperature ranging from 150 to 1000° C. for two minutes or less.

8. The method according to claim 3, wherein the gap has an aspect ratio of 250:1 or more.

9. The method according to claim 3, wherein the structure is a micron-scaled structure or a nano-scaled structure.

10. A method of producing a capacitive piezoelectric transducer, the method comprising:
   providing a layered substrate comprising:
   a base layer;
   a first electrode disposed on the base layer;
   a first layer disposed on the first electrode;
   a piezoelectric layer disposed on the first layer;
   a second layer disposed on the piezoelectric layer; and
   a second electrode disposed on the second layer; and
   releasing the piezoelectric layer, such that the first electrode is spaced apart from the piezoelectric layer by a first distance and the second electrode is spaced apart from the piezoelectric layer by a second distance.

11. The method of claim 10, wherein the releasing comprises:
   subjecting the layered substrate to conditions sufficient for at least a portion of the first layer and the first electrode to react to produce a first product compound and a first gap between the first electrode and the piezoelectric layer, and for at least a portion of the second layer and the second electrode to react to produce a second product compound and a second gap between the second electrode and the piezoelectric layer.

* * * * *